(12) United States Patent
Ng et al.

(10) Patent No.: US 10,049,885 B2
(45) Date of Patent: Aug. 14, 2018

(54) METHOD FOR PATTERNING A PLURALITY OF FEATURES FOR FIN-LIKE FIELD-EFFECT TRANSISTOR (FINFET) DEVICES

(71) Applicant: Taiwan Semiconductor Manufacturing Company, Ltd., Hsin-Chu (TW)

(72) Inventors: Hoi-Tou Ng, Hsinchu (TW); Kuei-Liang Lu, Hsinchu (TW); Ming-Feng Shieh, Tainan County (TW); Ru-Gun Liu, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/012,205

(22) Filed: Feb. 1, 2016

(65) Prior Publication Data

US 2016/0148815 A1 May 26, 2016

Related U.S. Application Data

(63) Continuation of application No. 14/485,168, filed on Sep. 12, 2014, now Pat. No. 9,252,021, which is a
(Continued)

(51) Int. Cl.
*H01L 21/308* (2006.01)
*H01L 21/033* (2006.01)
(Continued)

(52) U.S. Cl.
CPC ...... *H01L 21/3086* (2013.01); *H01L 21/0273* (2013.01); *H01L 21/0337* (2013.01);
(Continued)

(58) Field of Classification Search
CPC ......... H01L 21/3086; H01L 21/823431; H01L 21/845; H01L 21/3088; H01L 21/0338; H01L 21/0337
See application file for complete search history.

(56) References Cited

U.S. PATENT DOCUMENTS

| 7,862,962 B2 | 1/2011 | Shieh et al. |
| 8,039,179 B2 | 10/2011 | Shieh et al. |

(Continued)

FOREIGN PATENT DOCUMENTS

| CN | 101512754 A | 8/2009 |
| CN | 103187261 A | 7/2013 |
| CN | 103247574 A | 8/2013 |

*Primary Examiner* — Amar Movva
(74) *Attorney, Agent, or Firm* — Haynes and Boone, LLP

(57) ABSTRACT

A method for patterning fins for FinFET devices are disclosed. The method includes forming elongated protrusions on a semiconductor substrate and forming a mask covering a first portion of the elongated protrusions. The method further includes forming a spacer surrounding the mask. The mask and the spacer together cover a second portion of the elongated protrusions. The method further includes removing a portion of the elongated protrusions not covered by the mask and the spacer. In an embodiment, an outer boundary of the spacer and the mask corresponds to an outer boundary of a non-rectangular pattern.

20 Claims, 20 Drawing Sheets

Related U.S. Application Data continuation-in-part of application No. 13/369,818, filed on Feb. 9, 2012, now Pat. No. 9,236,267.

(51) Int. Cl.
*H01L 21/84* (2006.01)
*H01L 27/12* (2006.01)
*H01L 21/8234* (2006.01)
*H01L 21/027* (2006.01)

(52) U.S. Cl.
CPC ...... *H01L 21/0338* (2013.01); *H01L 21/3081* (2013.01); *H01L 21/3088* (2013.01); *H01L 21/823431* (2013.01); *H01L 21/845* (2013.01); *H01L 27/1211* (2013.01)

(56) References Cited

U.S. PATENT DOCUMENTS

| | | |
|---|---|---|
| 8,202,681 B2 | 6/2012 | Lin et al. |
| 8,318,603 B2 | 11/2012 | Lee et al. |
| 8,486,770 B1 | 7/2013 | Wu et al. |
| 8,728,332 B2 | 5/2014 | Lin et al. |
| 8,741,776 B2 | 6/2014 | De et al. |
| 8,822,243 B2 | 9/2014 | Yan et al. |
| 2006/0091468 A1 | 5/2006 | Liaw |
| 2010/0155786 A1* | 6/2010 | Heald ............. G03F 7/0754 257/213 |
| 2010/0183982 A1* | 7/2010 | Matsunaga ...... G03F 7/0035 430/296 |
| 2011/0151359 A1 | 6/2011 | Shieh et al. |
| 2011/0281208 A1 | 11/2011 | Lin et al. |
| 2012/0278776 A1 | 11/2012 | Lei et al. |
| 2013/0174103 A1 | 7/2013 | Shieh et al. |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0072527 A1 | 3/2015 | Ng et al. |
| 2015/0255299 A1 | 9/2015 | Cantone et al. |

* cited by examiner

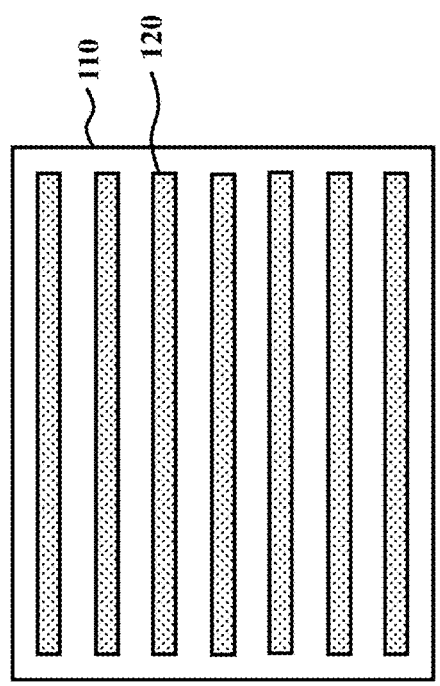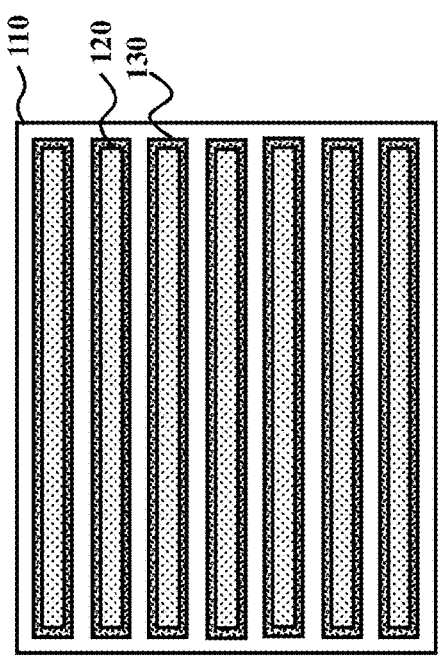

US 10,049,885 B2

METHOD FOR PATTERNING A PLURALITY OF FEATURES FOR FIN-LIKE FIELD-EFFECT TRANSISTOR (FINFET) DEVICES

PRIORITY DATA

This is a continuation of U.S. application Ser. No. 14/485,168, filed Sep. 12, 2014, entitled "Method for Patterning a Plurality of Features for Fin-Like Field-Effect Transistors (FINFET) Devices," which is a continuation-in-part of U.S. application Ser. No. 13/369,818, filed Feb. 9, 2012, entitled "Cut-Mask Patterning Process For Fin-Like Field Effect Transistor (FinFET) Device." The entire disclosure of both applications is hereby incorporated by reference.

BACKGROUND

Integrated circuit (IC) technologies are constantly being improved. Such improvements frequently involve scaling down device geometries to achieve lower fabrication costs, higher device integration density, higher speeds, and better performance. Lithography is frequently used for forming components of an integrated circuit device, where generally, an exposure tool passes light through a mask or reticle and focuses the light onto a resist layer of a wafer, resulting in the resist layer having an image of integrated circuit components therein. Forming device patterns with smaller dimensions is limited by a resolution of the exposure tool. For example, forming fin-like field effect (FinFET) devices is limited by current lithography resolution limits. Accordingly, although existing lithography techniques have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

FIGS. 1A, 1B, 1C, and 1D are views of an integrated circuit device on which a plurality of spacers are formed. FIGS. 1A-1C are top views, FIG. 1D is a side view of the integrated circuit device of FIG. 1C.

DETAILED DESCRIPTION

Figure 1C:
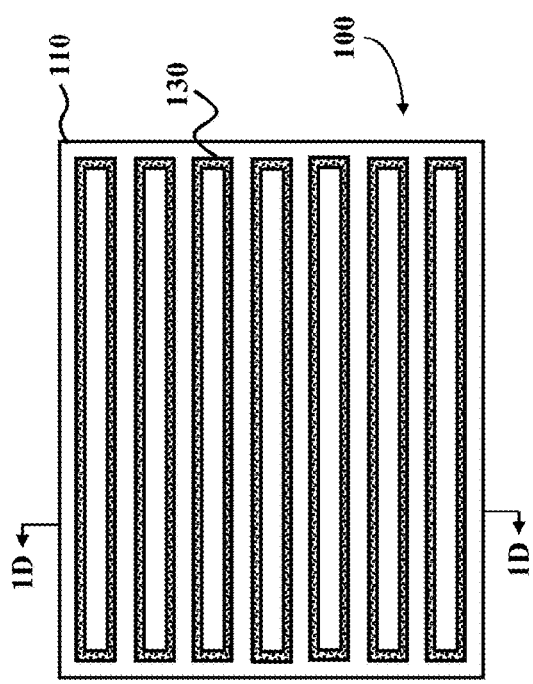

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, the present disclosure repeats various processes (such as patterning). The process will be described in greater detail and with a list of alternative embodiments the first time it is discussed. Thereafter, the process will be described in more general detail to avoid unnecessary repetition. It is understood, however, that such detail and alternative embodiments may also be applied to the later-discussed processes.

The present disclosure is directed to an integrated circuit device during various stages of fabrication. The integrated circuit device is an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. In some of the depicted embodiments, as further discussed below, the integrated circuit device includes various FinFET devices, and the integrated circuit device is illustrated during various stages of FinFET device fabrication. The term FinFET device refers to any fin-based, multi-gate transistor. Additional features can be added in the integrated circuit device, and some of the features described below can be replaced or eliminated in other embodiments of the integrated circuit device.

Referring to FIGS. 1A-1D, a first or main masking process is performed to define a width and a pitch of fins of various fin structures of the integrated circuit device 100, where the fin structures are included in various FinFET devices. In FIG. 1A, a substrate 110 is provided. In the present example, the substrate 110 is a semiconductor substrate including a stack of silicon (Si) and silicon dioxide (SiO2). Alternatively or additionally, the substrate 110 includes an elementary semiconductor, such as silicon or germanium; a compound semiconductor, such as silicon carbide, gallium arsenide, gallium phosphide, indium phosphide, indium arsenide, and/or indium antimonide; or combinations thereof. Alternatively, the substrate 110 is a silicon-on-insulator (SOI) substrate, which can be fabricated using separation by implantation of oxygen (SIMOX), wafer bonding, or other methods. The substrate 110 may include various doped regions and other suitable features.

An array of mandrels 120 are disposed over the substrate 110, where adjacent mandrels 120 are spaced from one another. The mandrels 120 include a patterning or masking material, such as a resist material, polysilicon, silicon oxide, silicon nitride, other patterning or masking material, or combinations thereof. In an example, forming the mandrels 120 includes depositing a patterning or masking layer (such as a polysilicon layer) over the substrate 110; forming a resist layer over the masking layer; using a mandrel mask (which may be referred to as a main mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer that exposes portions of the masking layer; and using the patterned resist layer to etch the masking layer, specifically, the exposed portions of the masking layer, to form the mandrels 120 as illustrated in FIG. 1A. In other examples, the mandrels 120 are formed by various deposition processes, lithography processes, etching processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other deposition methods, or combinations thereof. The lithography processes may include resist coating (for example, spin-on coating), soft baking, mask aligning, exposure, post-exposure baking, developing the resist, rinsing, drying (for example, hard baking), other lithography process, or combinations thereof. Alternatively, the lithography processes can be implemented or replaced by other methods, such as maskless lithography, electron-beam writing, ion-beam writing, and/or nanoimprint technology. The etching processes include dry etching, wet etching, other etching methods, or combinations thereof.

In FIG. 1B, spacers 130 are formed over the substrate 110, such that each of the mandrels 120 is surrounded by a spacer 130; and in FIG. 1C, the mandrels 120 are removed, for example, by an etching process, such that the spacers 130 remain disposed over the substrate 110. The spacers 130 include a patterning or masking material, which in the present embodiment is silicon nitride (SiN). Other examples include a resist material, polysilicon, silicon oxide, other patterning or masking material, or combinations thereof. The spacers 130 are formed by various deposition processes, lithography processes, etching processes, or combinations thereof, such as the processes described herein. The spacers 130 on opposite sidewalls of each mandrel 120 have a width that is less than the width of each mandrel 120. The spacers on opposite sidewalls of each mandrel 120 are also spaced from one another by a pitch that is less than the pitch of the mandrels 120. As further described below, the spacers 130 are used to form the fin structures of the integrated circuit device 100, and are hereinafter referred to as fins 130.

Figure 1D:
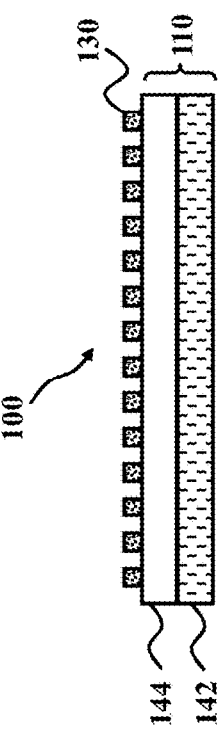

It is desired to pattern the group of fins 130 shown in FIGS. 1C and 1D to a predetermined non-rectangular pattern. As will be discussed further below, difficulties often arise in shaping the fins 130, especially end-cutting the fins so that the ends of the fins are uniformly aligned and do not include corner rounding, especially around inside corners of the non-rectangular pattern.

Figure 2:
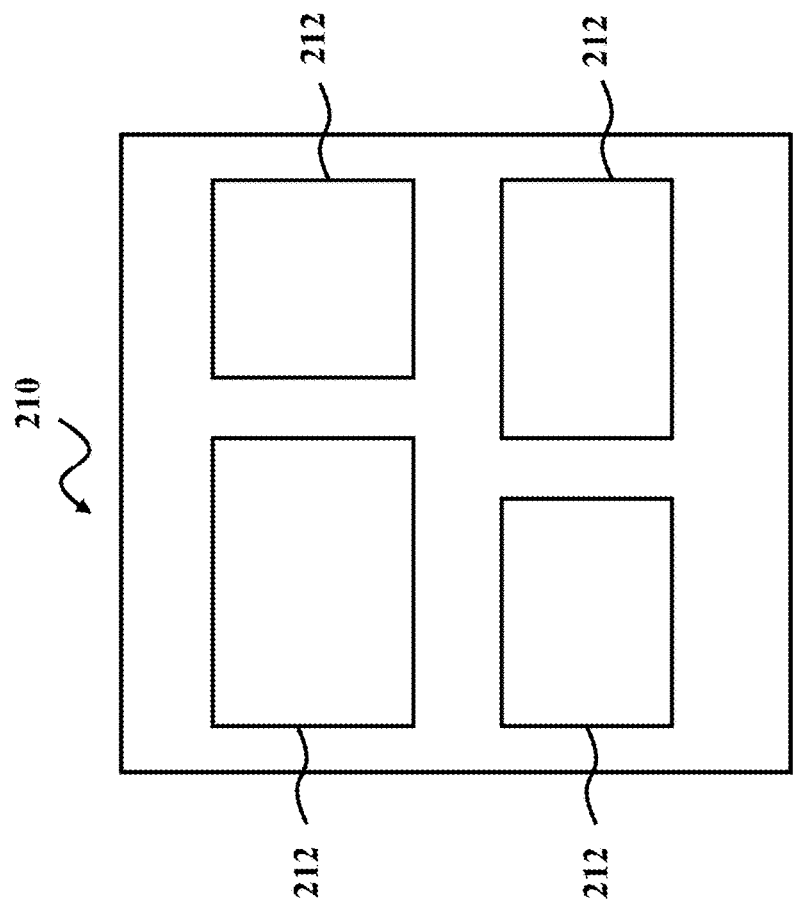
FIGS. 2, 5, 8, 9, and 14 are top views of masks used for further processing the device of FIG. 1 according to one or more embodiments of the present invention.

Referring now to FIG. 2, a mask 210 will be used in the present embodiment to remove some or all of the fins 130 (line cutting) to form a non-rectangular pattern. It is understood that the mask can be modified according to general understandings of lithography and mask making, as is well known in the art. For example, the present examples will implement a positive photoresist, in that clear tones on the mask are used to expose corresponding patterns on the photoresist. Of course, negative photoresist can also be used, in that dark tones on the mask are used to expose corresponding patterns on the photoresist. Also, known techniques such as optical proximity correction can be used, as is well known in the art. Furthermore, the lithography processes discussed below can be of various types and include multiple steps, such as those discussed above with reference to FIGS. 1A-1C.

The mask 210 can be formed in various technologies. For example, the mask may be formed using a binary technology. The binary mask includes a transparent substrate (for example, fused quartz) and an opaque material (for example, chromium) coated in the opaque regions of the mask. In another example, the masks are formed using a phase shift technology, where various features in the pattern formed on the masks are configured to have proper phase difference to enhance the resolution and imaging quality. In various examples, the phase shift mask (PSM) can be an attenuated PSM or alternating PSM.

The mask 210 is used for line cutting, and provides the non-rectangular pattern 212 that is desired in the present embodiment. The non-rectangular pattern 212 is shown to be a dark tone, while a surrounding area is shown to be a clear tone. The non-rectangular pattern 212 will be used to form a corresponding pattern of the fins 130 on the device 100.

Figure 4:
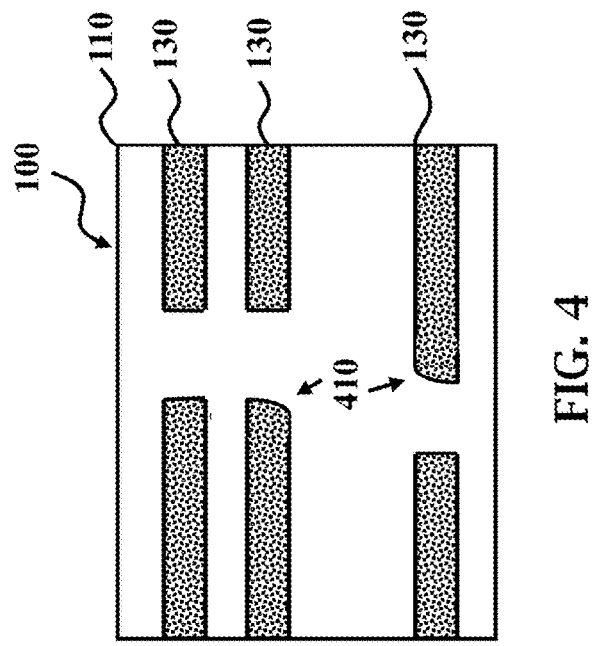
FIGS. 3A, 3B, and 4 are top and cross-sectional views of the integrated circuit device of FIG. 1 being processed using the masks of FIG. 2, according to one or more embodiments of the present invention.
Figure 3A:
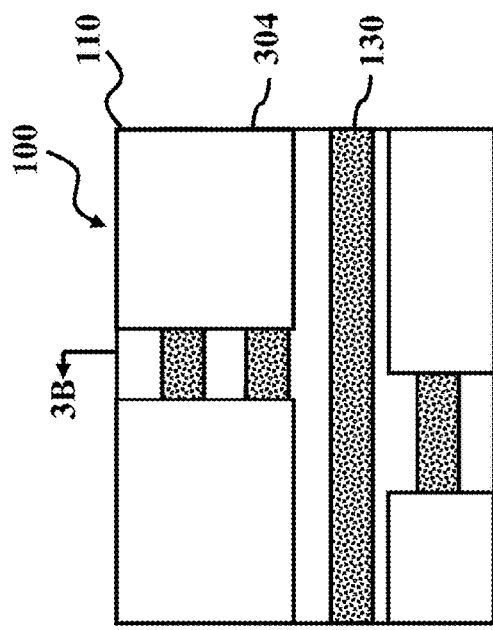
Figure 3B:
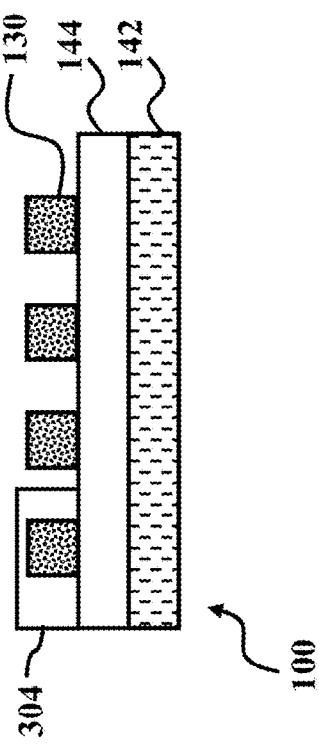

Referring to FIGS. 3A, 3B, and 4, in the present embodiment, a layer of photoresist is applied to the device 100 above the SiN fins 130 and above the substrate 110, which includes layers of Si 142 and SiO2 144. The mask 210 is used in a lithography process to form a non-rectangular photoresist pattern 304 on the device. The non-rectangular pattern corresponds to the pattern 212 of the mask 210 (FIG. 2). A SiN-selective etch process (not selective to SiO2) is then performed to remove the portions of the SiN fins 130 to produce the non-rectangular fin pattern as shown in FIG. 4. Some example etchants are CF4 or SF6. Afterwards, the non-rectangular photoresist pattern 304 is removed. As shown in FIG. 4, ends 410 of the fins 130 are ragged, in that they are neither the correct length, nor uniform. It is also noted that the inside corners of the pattern 304, as shown in FIG. 4, are curved. This is due, at least in part, to lithography resolution limits, especially around pattern corners.

Figure 5:
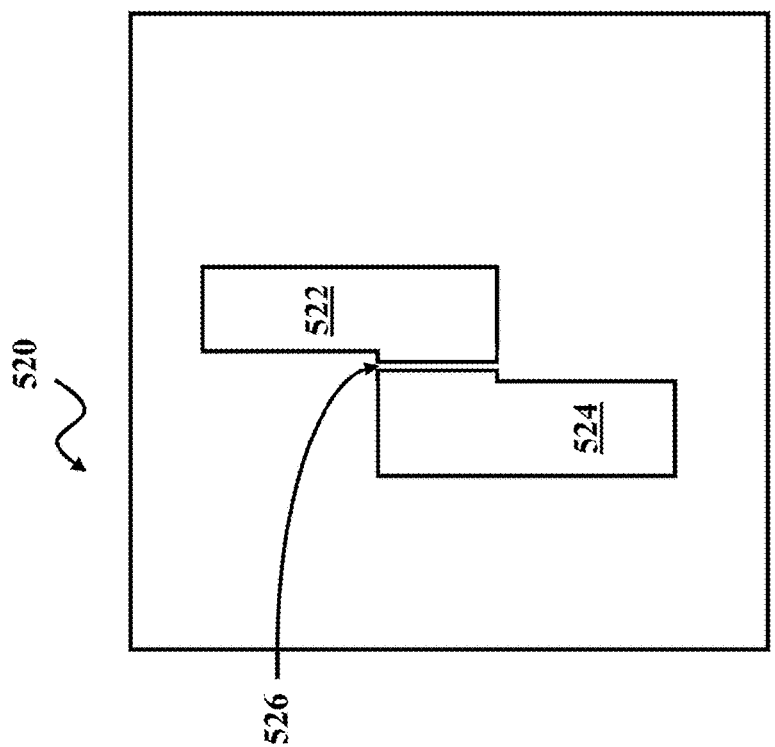

Referring now to FIG. 5, a mask 520 will be used in the present embodiment to cut the ends of the fins 130 into the non-rectangular pattern. The mask 520 can be used after the mask 210 (FIG. 2) has been used for line cutting, or the mask 520 can be used alone to perform both line cutting and end cutting. It is understood that the mask can be modified according to general understandings of lithography and mask making, as is well known in the art, such as discussed above with reference to FIG. 2. Also, the mask 520 can be formed in various technologies, as also discussed above with reference to FIG. 2. The mask 210 is used for end cutting, and provides a non-rectangular pattern that is desired in the present embodiment.

The mask 520 includes two rectangular patterns 522 and 524 that are very close to each other at an intersection area, as shown. In the intersection area between the two patterns 522, 524 is a sub-resolution feature 526. The sub-resolution feature 526 has properties, such as size or shape that would normally be considered outside of the resolution limits of a corresponding lithography process. In the present embodiment, the sub-resolution feature 526 is of a type that is often used for optical proximity correction (OPC), similar to scattering bars which are well known in the art. By being placed in the intersection area adjacent to the two patterns 522, 524, the sub-resolution feature 526 introduces counter proximity effects, sometimes referred to as an isolated/dense proximity effect. As will be discussed in greater detail below, the use of the sub-resolution feature 526 produces unique effects on the resulting pattern formed on the device.

Figure 7:
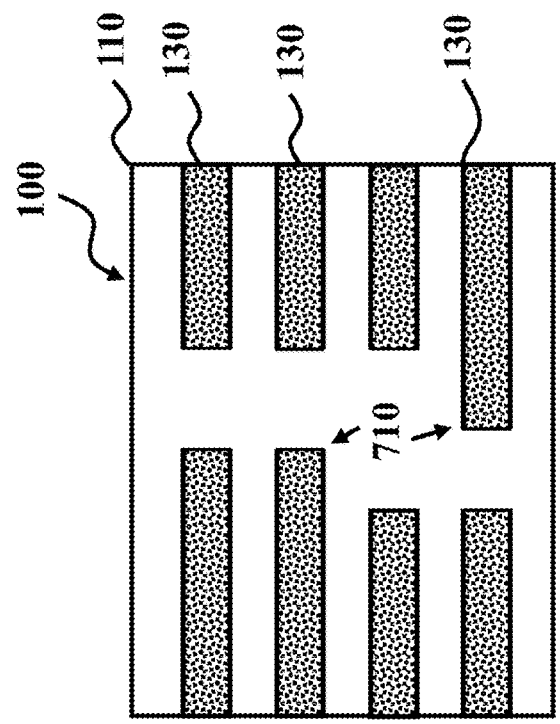
FIGS. 6 and 7 are top views of the integrated circuit device of FIG. 1 being processed using the masks of FIG. 5, according to one or more embodiments of the present invention.
Figure 6:
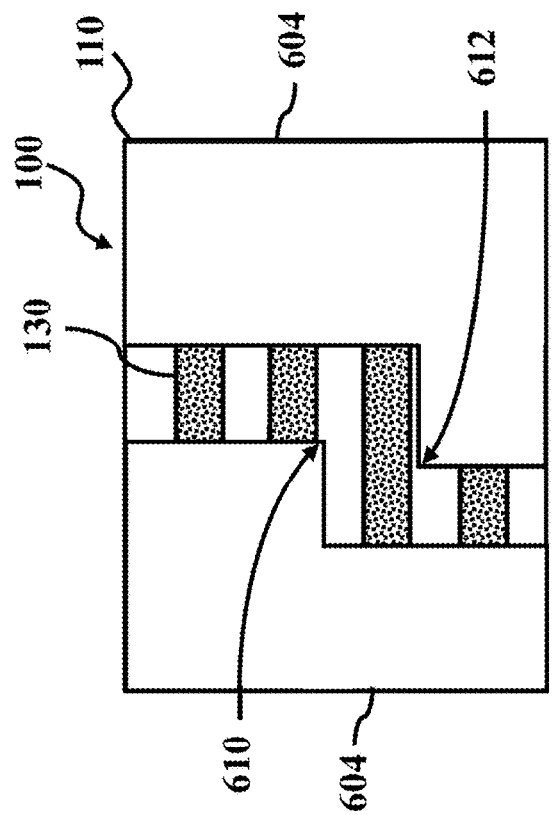

Referring to FIGS. 6-7, in the present embodiment, a layer of photoresist is applied to the device 100 above the SiN fins 130 and above the substrate 110, which includes layers of Si 142 and SiO2 144. The mask 520 is used in a lithography process to form a non-rectangular photoresist pattern 604 on the device. The non-rectangular pattern corresponds to the patterns of the mask 520 (FIG. 5). The patterns 522 and 524 are connected by the presence of the sub-resolution feature 526 on the mask 520. The sub-resolution feature 526 will not result in a patterned line on the substrate after exposure because it is an assist pattern. Without the sub-resolution feature 526, there will be corner rounding, as in the ends 410 discussed above (FIG. 4). With the sub-resolution feature 526, the corner rounding will be reduced. A SiN-selective etch process (not selective to SiO2) is then performed to remove the portions of the SiN fins 130 outside of the non-rectangular pattern to produce the non-rectangular fin pattern as shown in FIG. 7. Afterwards, the non-rectangular photoresist pattern 604 is removed. As shown in FIG. 7, ends 710 of the fins 130 are not as ragged as those in FIG. 4, but instead are relatively uniform. It is also noted that the inside corners of the pattern, as shown in FIG. 7, are not as curved as those in FIG. 4. This is due, at least in part, to the sub-resolution feature 526.

Figure 9:
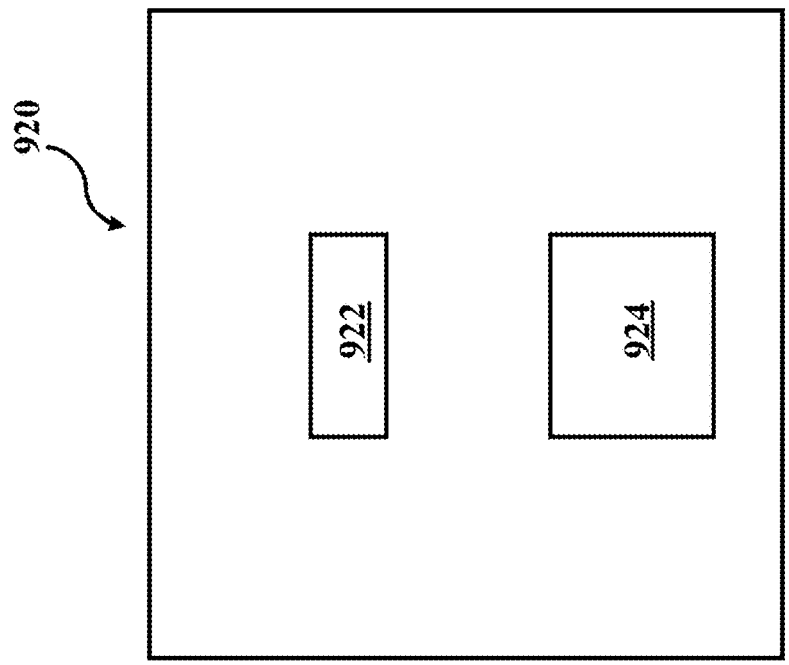
Figure 8:
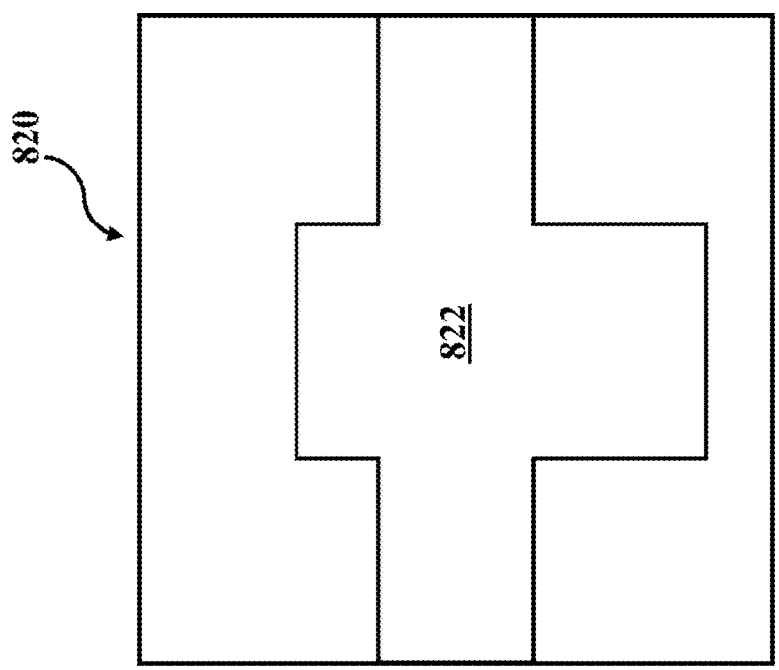

Referring now to FIGS. 8 and 9, in another embodiment, a mask 820 will be used for removing some or all of the fins 130 of FIG. 1D (line cutting) and a mask 920 will be used for further cutting the ends of the remaining fins to form a non-rectangular pattern. It is understood that the masks 820, 920 can be modified according to general understandings of lithography and mask making, as is well known in the art, such as discussed above with reference to FIG. 2. Also, the masks 820, 920 can be formed in various technologies, as also discussed above with reference to FIG. 2. The masks 820, 920 provide a non-rectangular pattern that is desired in the present embodiment. The mask 820 includes a non-rectangular pattern 822 and the mask 920 includes two rectangular patterns 922 and 924.

Figure 11:
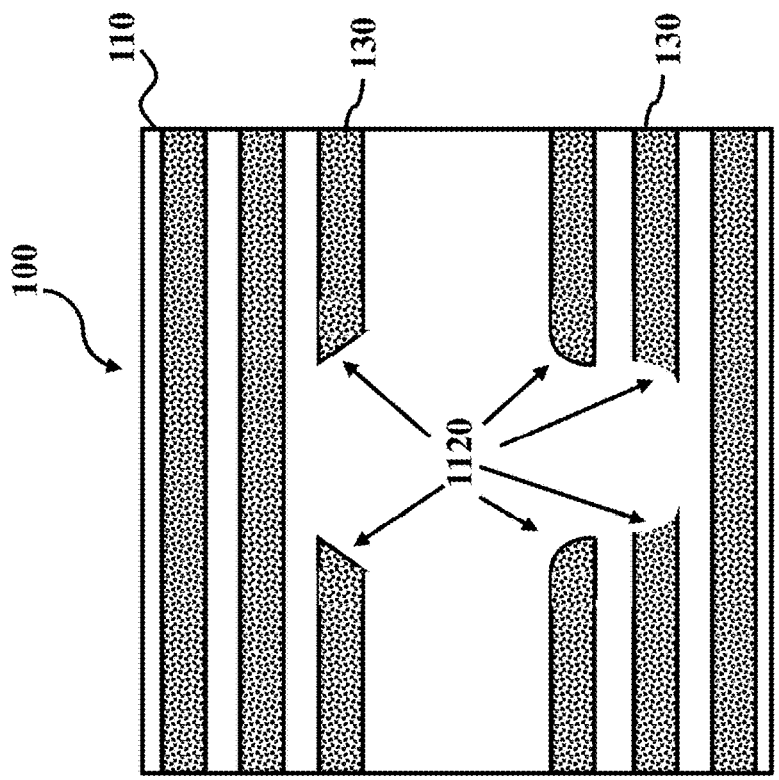
FIGS. 10, 11, 12, and 13 are top views of the integrated circuit device of FIG. 1 being processed using the masks of FIGS. 8-9, according to one or more embodiments of the present invention.
Figure 10:
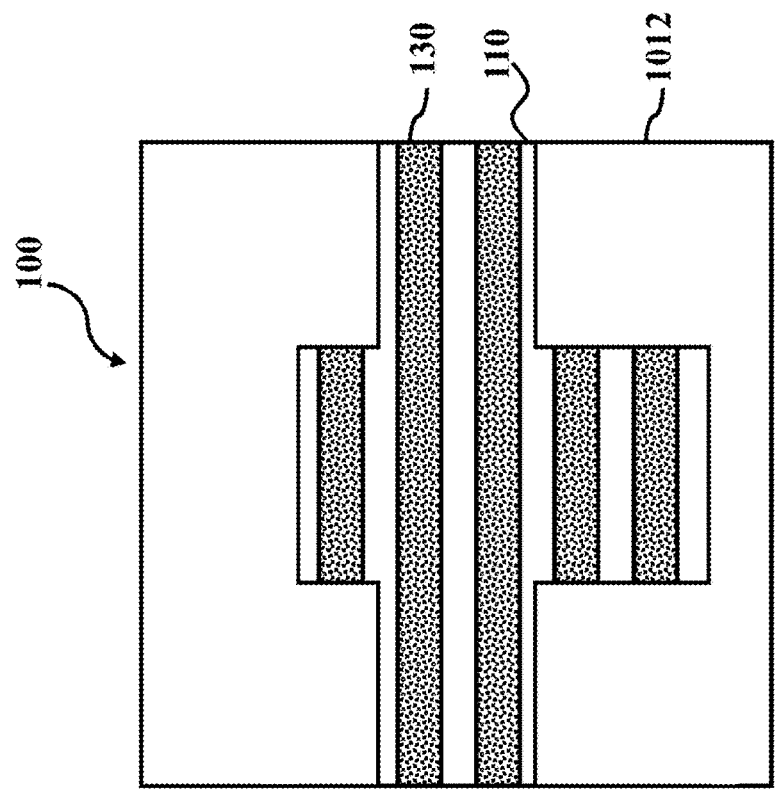

Referring to FIGS. 10 and 11, in the present embodiment, a layer of photoresist is applied to the device 100 above the SiN fins 130 and above the substrate 110. The mask 820 is used in a lithography process to form a non-rectangular photoresist pattern 1012 on the device 100. The non-rectangular pattern corresponds to the patterns of the mask 820 (FIG. 8). A SiN-selective etch process (not selective to SiO2) is then performed to remove the portions of the SiN fins 130 outside of the non-rectangular pattern to produce the non-rectangular fin pattern as shown in FIG. 11. Afterwards, the non-rectangular photoresist pattern 604 is removed. As shown in FIG. 11, some of the fins 130 are removed. Some of the remaining fins have ends 1120 that are curved around corners.

Figure 13:
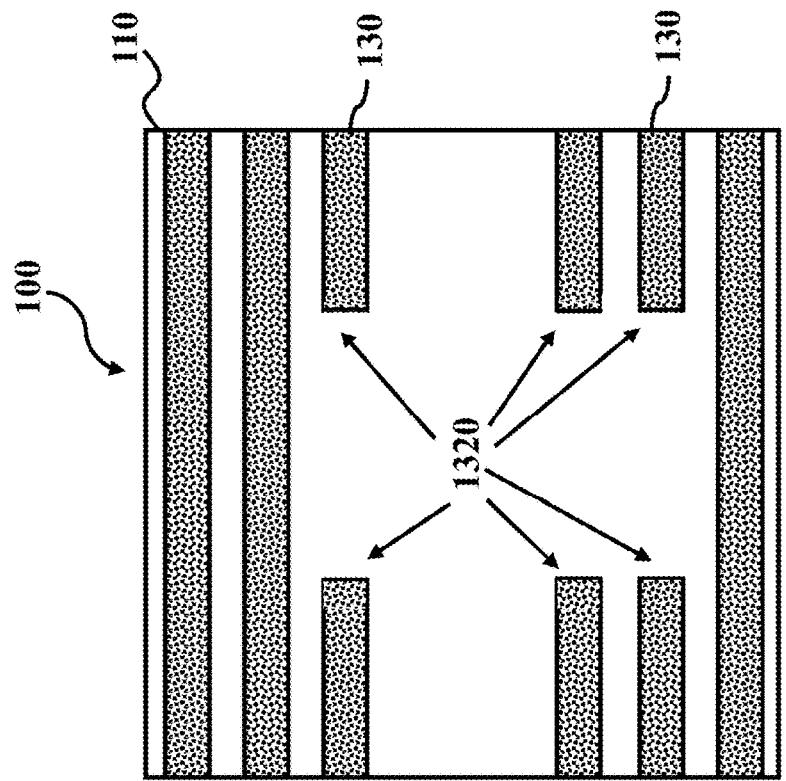
Figure 12:
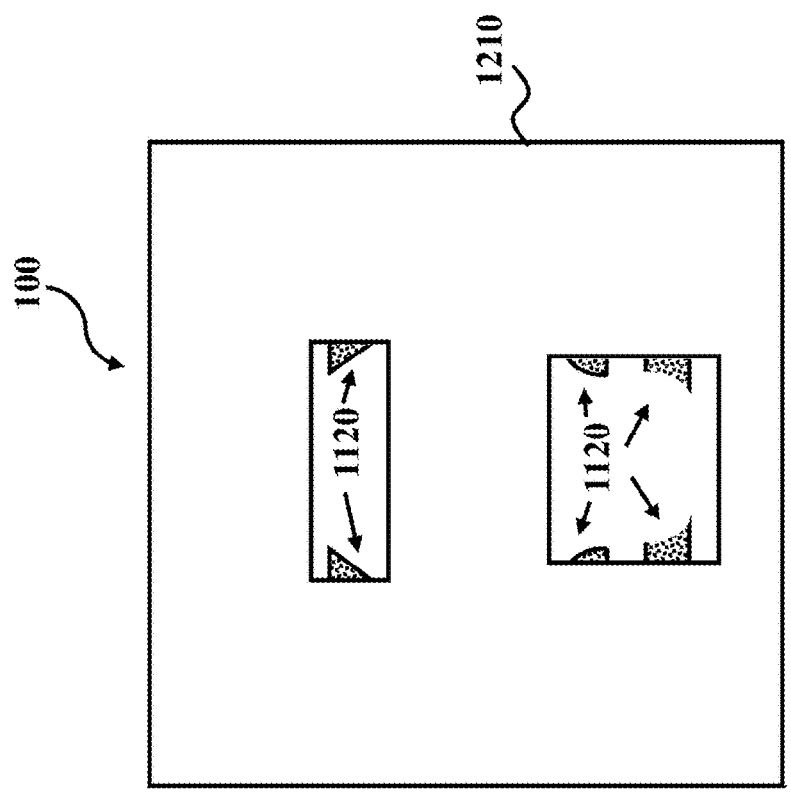

Referring to FIGS. 12 and 13, next, a second layer of photoresist is applied to the device 100 above the remaining SiN fins 130. The mask 920 is used in a lithography process to form a non-rectangular photoresist pattern 1210 on the device 100. The non-rectangular pattern corresponds to the patterns of the mask 920 (FIG. 9). A SiN-selective etch process (not selective to SiO2) is then performed to cut the SiN fins 130 outside of the non-rectangular pattern to produce the non-rectangular fin pattern as shown in FIG. 13. Afterwards, the non-rectangular photoresist pattern 604 is removed. As shown in FIG. 11, ends 1320 of the fins 130 are not as ragged as those in FIG. 11, but instead are relatively uniform. It is also noted that the inside corners of the pattern, as shown in FIG. 13, are not as curved as those in FIG. 11.

Figure 14:
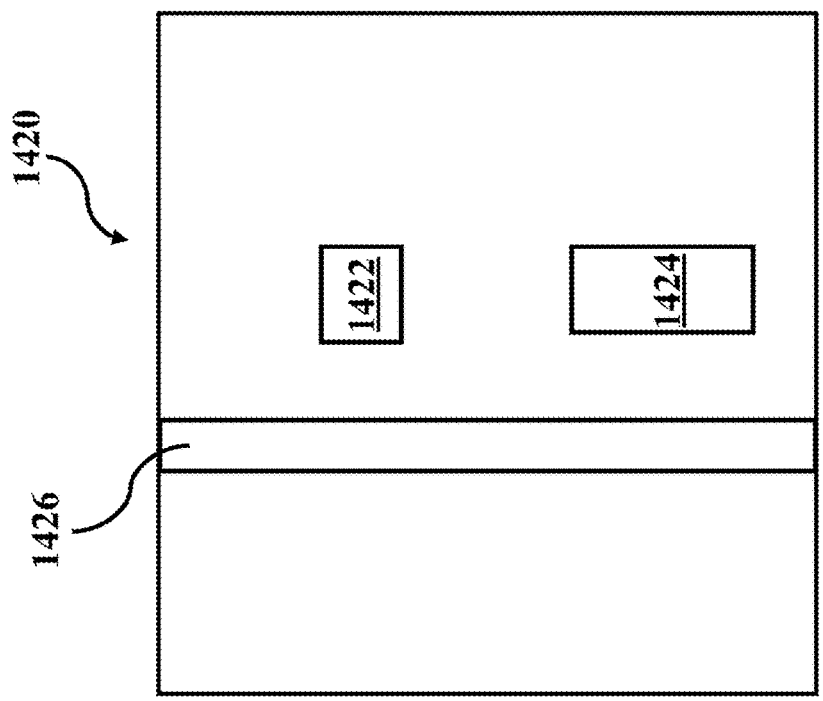

There are several additional alternative embodiments to those discussed above. Referring to FIG. 14, a mask 1420 can be used in place of the mask 920 (FIG. 9) for cutting the ends of the remaining fins 130 to form a non-rectangular pattern. The mask 1420 includes patterns 1422 and 1424 that correspond with the right side (as shown in FIG. 9) of the patterns 922, 924, respectively. However, a single line cutting pattern 1426 is provided to correspond with the left side (as shown in FIG. 9) of the patterns 922, 924. It is understood that the mask 1420 can be modified according to general understandings of lithography and mask making, as is well known in the art, as discussed above with reference to FIG. 2.

In another embodiments, an E-beam patterning device can be used in place of the mask 920 (FIG. 9) for cutting the ends of the remaining fins 130 to form a non-rectangular pattern. E-beam patterning can improve on the ragged and rounded line ends, albeit at a slightly reduced throughput.

In other embodiments, a hardmask process can be used to form the patterns discussed above. For example, a first layer of amorphous silicon can be formed over the device, including the fins, and then a photoresist layer is deposited thereon. The photoresist layer is patterned as discussed above, and then the underlying amorphous silicon layer is patterned to form the hardmask. Patterning of the underlying layers continues as above, using the patterned hardmask.

In still other embodiments, the above described masks and methods can be used for making other features besides fins, such as a pattern of trenches.

Figure 15:
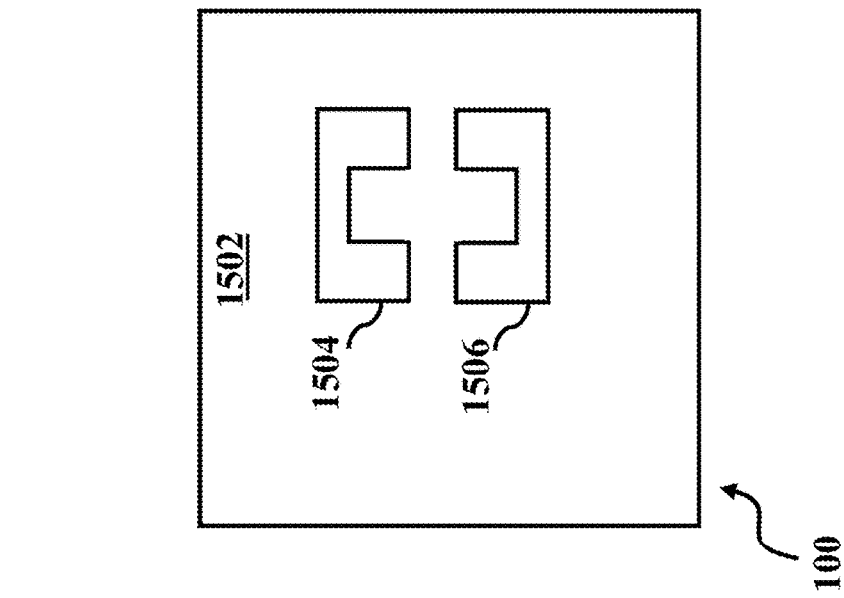
FIG. 15 is a top view of an integrated circuit device according to one or more embodiments of the present invention.

Referring now to FIG. 15, illustrated is the device 100 with a circuit area 1502 that includes a plurality of non-rectangular areas 1504 and 1506. In the embodiment of the device 100, the non-rectangular area 1504 may include n-type FinFETs and the non-rectangular area 1506 may include p-type FinFETs. It is understood that although the non-rectangular areas 1504, 1506 are shown as U-shaped, other non-rectangular shapes may also be used, including L-shapes, E-shapes, and so forth.

Referring now to FIGS. 16-22, illustrated are top views of an integrated circuit device 2000 during various stages of fabrication according to various aspects of the present disclosure. The integrated circuit device 2000 is an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. In the depicted embodiment, as further discussed below, the integrated circuit device 2000 includes various FinFET devices, and the integrated circuit device 2000 is illustrated during various stages of FinFET device fabrication. The term FinFET device refers to any fin-based, multi-gate transistor. FIGS. 16-22 have been simplified for the sake of clarity to better illustrate the inventive concepts of the present disclosure. Additional features may be added in the integrated circuit device 2000, and some of the features described below can be replaced or eliminated in other embodiments.

In more detail, the fabrication method illustrated in FIGS. 16-22 will pattern fin structures into a predetermined non-rectangular pattern. As will be discussed below, this fabrication method overcomes many of the issues that typically arise when patterning fins into a non-rectangular shape, such as exterior and interior corner rounding.

Figure 16:
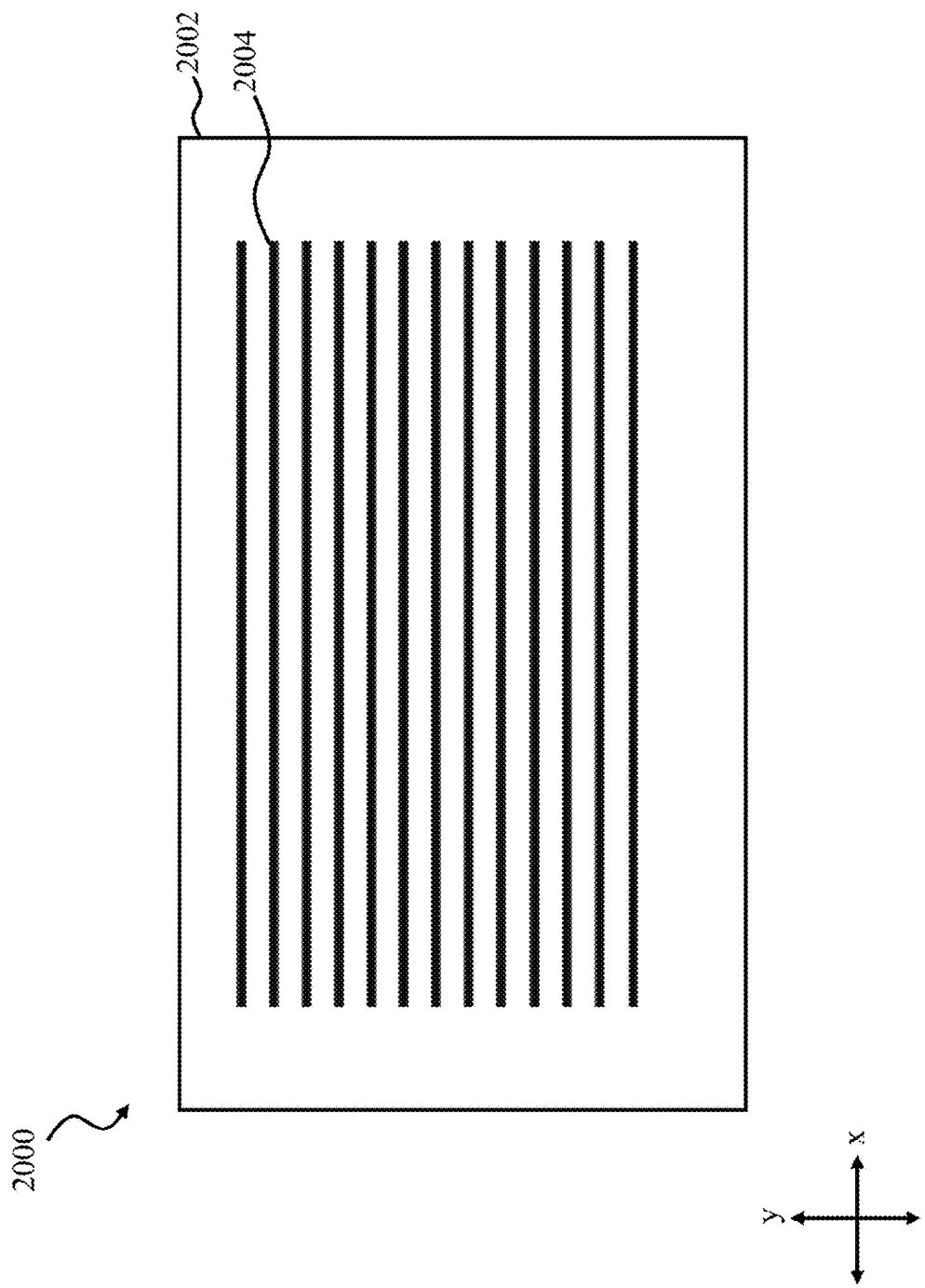
FIGS. 16, 17, 18, 19, 20 and 22 are top views of an integrated circuit device during various stages of fabrication according to various aspects of the present disclosure.

Referring now to FIG. 16, a substrate 2002 is provided. In the present example, the substrate 2002 is a semiconductor substrate including a stack of silicon (Si) and silicon dioxide (SiO2). Alternatively or additionally, the substrate 2002 includes an elementary semiconductor, such as silicon or germanium; a compound semiconductor, such as silicon carbide, gallium arsenide, gallium phosphide, indium phosphide, indium arsenide, and/or indium antimonide; or combinations thereof. Alternatively, the substrate 2002 is a silicon-on-insulator (SOI) substrate, which can be fabricated using separation by implantation of oxygen (SIMOX), wafer bonding, or other methods. In various embodiments, the substrate 2002 may include various doped regions and other suitable features.

An array of fin structures 2004 (i.e., elongated protrusions) are disposed over the substrate 2002, where adjacent fin structures 2004 are spaced from one another. In the illustrated embodiment, the fin structures 2004 extend in the x-direction. One of ordinary skill in the art would recognize that the x and y directions shown in the figures are arbitrary and are for the sake of illustration only. The fin structures 2004, in one embodiment, are silicon (Si) fins that extends from the substrate 2002. The fin structures 2004 are formed by a suitable process, such as a lithography and etching process. For example, the fin structures 2004 may be formed by forming a photoresist layer (resist) overlying the substrate, exposing the resist to a pattern, performing a post-exposure bake process, and developing the resist to form a masking element including the resist. The masking element may then be used to etch the fin structures 2004 into the substrate 2002. The fin structures 2004 may be etched using a reactive ion etch (RIE) and/or other suitable process. Alternatively, the fin structures 2004 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

In other embodiments, the fin structures 2004 are formed by various deposition processes, lithography processes, etching processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other deposition methods, or combinations thereof. The lithography processes may include resist coating (for example, spin-on coating), soft baking, mask aligning, exposure, post-exposure baking, developing the resist, rinsing, drying (for example, hard baking), other lithography process, or combinations thereof. Alternatively, the lithography processes can be implemented or replaced by other methods, such as maskless lithography, electron-beam writing, ion-beam writing, and/or nanoimprint technology. The etching processes include dry etching, wet etching, other etching methods, or combinations thereof.

Further, in some embodiments, isolation features, such as shallow trench isolation (STI) structures, may surround the fin structures 2004 and isolate the fin structures from other elements on the integrated circuit device 2000. Such isolation features may be formed by partially filling trenches surrounding the fin structures 2004 (formed after etching the substrate 2002 to form the fin structures 2004) with an insulating material, such as silicon oxide, silicon nitride, silicon oxynitride, other suitable material, or combinations thereof. The filled trench may have a multi-layer structure, for example, a thermal oxide liner layer with silicon nitride filling the trench.

Figure 17:
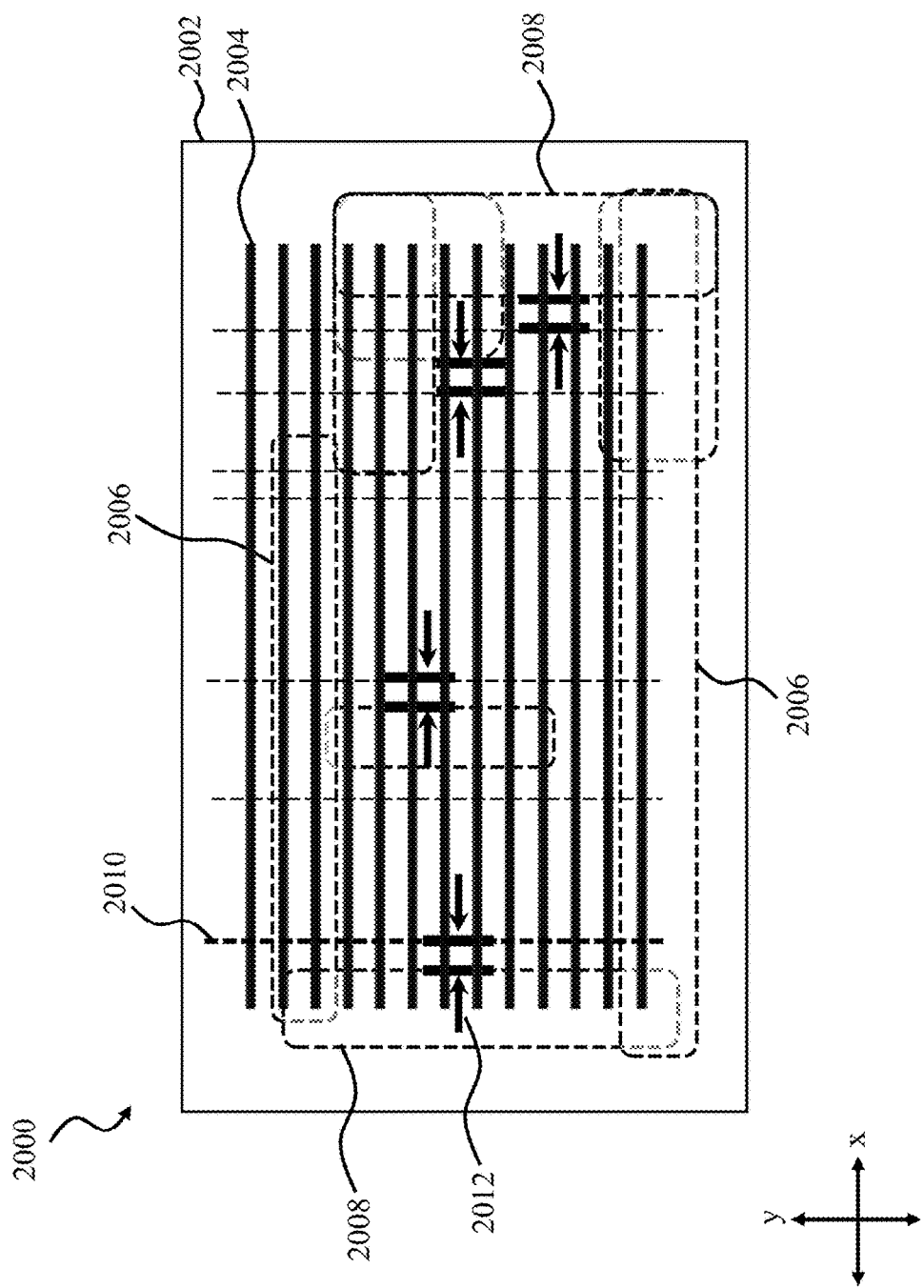

Referring now to FIG. 17, illustrated is a subsequent stage in the method for patterning the fin structures 2004 on the integrated circuit device 2000. Specifically, FIG. 17 shows a plurality of horizontal cut regions 2006 that extend in the x-direction and a plurality of vertical cut regions 2008 that extend in the y-direction. The horizontal and vertical cut regions 2006 and 2008 are those regions in which the fin structures 2004 will be removed during subsequent lithography processing. Specifically, the horizontal and vertical cut regions 2006 and 2008 represent the regions of the fin structures 2004 that will be removed during an etch process. For example, in one embodiment, a photomask that includes open or transparent regions corresponding to the horizontal and vertical cut regions 2006 and 2008 may be used during an exposure of the fin structures 2004. The exposed regions of the fin structures 2004 corresponding to the horizontal and vertical cut regions 2006 and 2008 may then be removed during an etch process. In other embodiments, a hard mask may be deposited on the fin structures 2004 in the regions other than the horizontal and vertical cut regions 2006 and 2008. During a subsequent etching process, the unprotected portions of the fin structures 2004 corresponding to the horizontal and vertical cut regions 2006 and 2008 may be removed. In other embodiments, any number of additional lithography techniques may be utilized to remove the portions of the fin structures 2004 corresponding to the horizontal and vertical cut regions 2006 and 2008, such as the techniques discussed below.

In FIG. 17, a broken line 2010 represents the location of one edge of the desired non-rectangular pattern that will be formed in the fin structures 2004. As shown in FIG. 17, the vertical cut region 2008 to the left of the broken line 2010 is not aligned with the broken line in the y-direction such that there is a gap 2012 therebetween. As such, when the portion of the fin structure within the vertical cut region 2008 is removed, the remaining fin structure portions will still extend past the broken line 2010 in the x-direction and not correspond to the edge of the non-rectangular pattern. This technique may be referred to as a "loose" cut in the x-direction (horizontal direction) because alignment of the vertical cut region 2008 with the edge of the non-rectangular pattern is not required. The remaining portions of fin structures 2004 that extend past the broken link 2010 will be removed in a subsequent step of the patterning process. As shown in FIG. 17, several of these loose cuts in the x-direction are made to the fin structures 2004 using the vertical cut regions 2008. In some embodiments, the fins structures may be patterned using only horizontal cut regions or only vertical cut regions. Or, in other embodiment, the fin structures may not be patterned at all using the horizontal or vertical cut regions and are only be patterned using the techniques described in association with FIG. 20.

Figure 18:
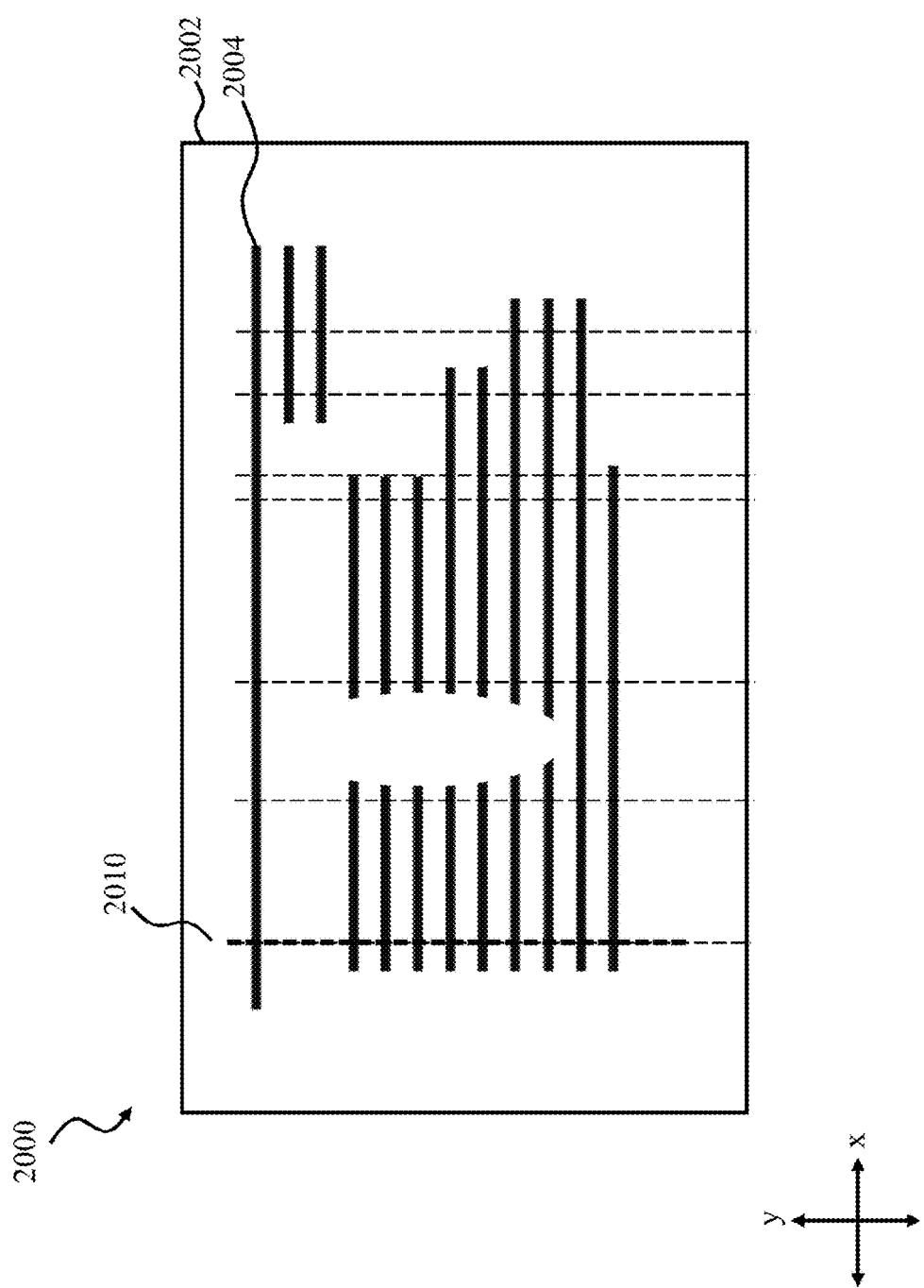

Referring now to FIG. 18, illustrated are the remaining portions of the fin structures 2004 after the integrated circuit device 2000 has undergone the removal process using the horizontal and vertical cut regions 2006 and 2008 shown in FIG. 17. As shown, the portions of the fin structures 2004 that have been removed roughly correspond to the horizontal and vertical cut regions 2006 and 2008. Further, because of the loose cut technique employed during the etching process, portions of the fin structures 2004 extend horizontally to the left of the broken line 2010.

Figure 19:
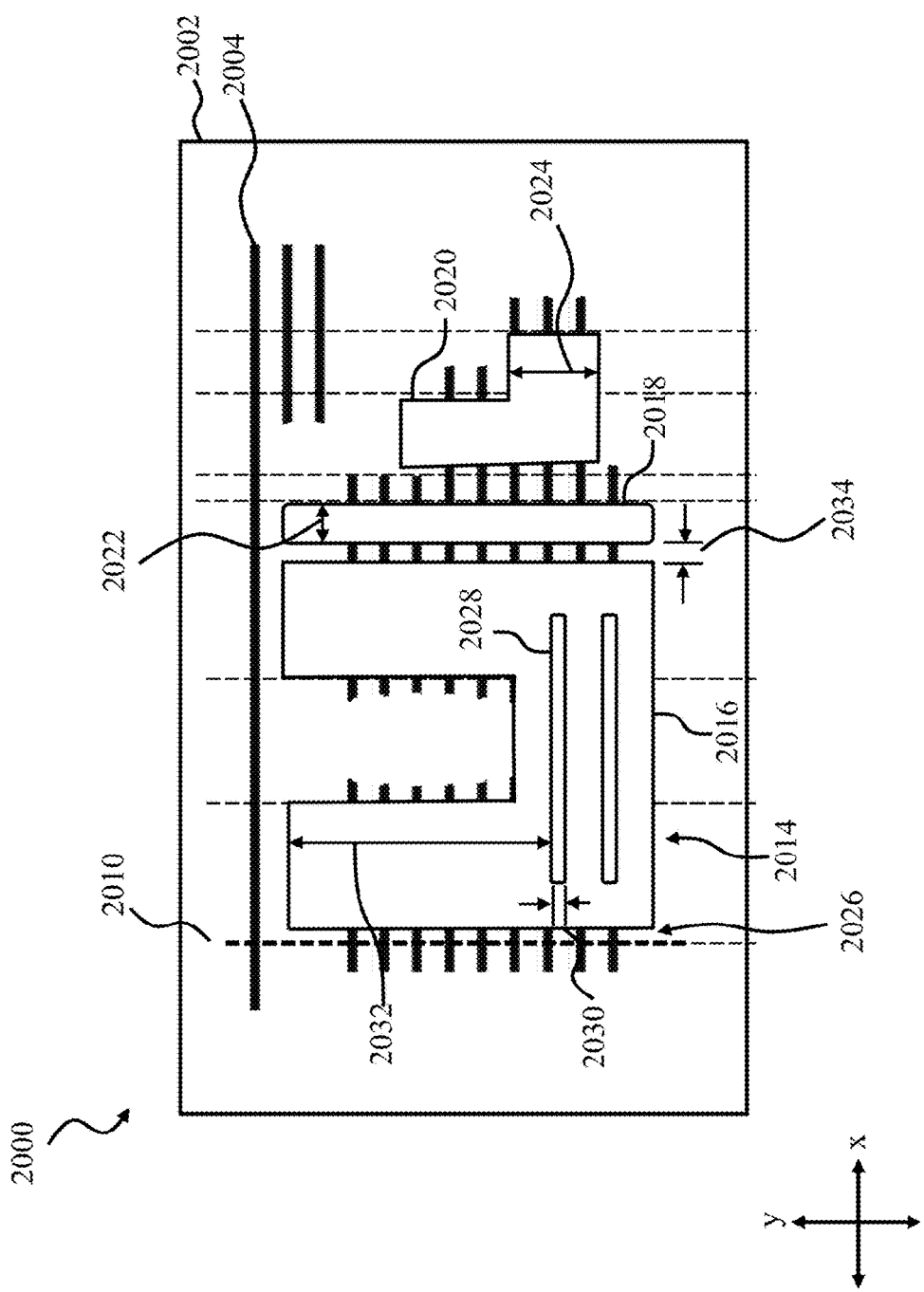

Referring now to FIG. 19, illustrated is a subsequent stage in the method for patterning the fin structures 2004 on the integrated circuit device 2000. Specifically, in FIG. 19, a protect mask 2014 has been formed over the fin structures 2004. In one embodiment, the protect mask 2014 is formed by depositing and patterning a layer of photoresist material on the fin structures 2004, leaving covered portions of the fin structures 2004 and uncovered portions of the fin structures 2004. In the illustrated embodiment of FIG. 19, the protect mask 2014 includes a plurality of spaced mask portions 2016, 2018, and 2020, that, taken together, roughly approximate the shape of the non-rectangular pattern to be formed in the fin structures 2004. In other embodiments, the protect mask may consist of a single continuous photoresist portion, or it may consist of any number of spaced mask portions. The outer boundary of the protect mask 2014, however, is within the outer boundary of the non-rectangular pattern to be formed in the fin structures 2004 (i.e., the former has a smaller area than the latter). For example, the left-most edge of the spaced mask portion 2016 is not aligned in the y-direction with the broken line 2010 that represents an outer edge of the desired non-rectangular pattern. There exists a small gap 2026 that is approximately as wide as a spacer that will be deposited on the sidewall of the spaced mask portion 2016, as will be discussed further in association with FIG. 20. Additionally, the spaced mask portion 2014 includes an opening 2028 with a width 2030. The width 2030 is approximately equal to or less than the width of two spacers deposited on opposing sidewalls forming the opening 2028. As will be shown in FIG. 20, the opening 2028 has a width such that it would be partially or entirely filled with spacer material during a subsequent spacer deposition process. In the illustrated embodiment, the spaced mask portion 2016 of the protect mask 2014 includes a second opening with similar dimensions to the opening 2028.

Individually, each of the spaced mask portions 2016, 2018, and 2020 of the protect mask 2014 have dimensions that fall within the critical dimension limits of the lithography equipment utilized to form the desired non-rectangular pattern. For example, in FIG. 19, the spaced mask portion 2018 has a dimension 2022 in the x-direction and the spaced mask portion 2020 has a dimension 2024 in the y-direction, each of which may be formed without undesired defects. Additionally, the spaced mask portion 2016 includes a dimension 2032 in the y-direction measured from a top edge of the spaced mask portion to the opening 2028. The opening 2028 allows the spaced mask portion 2016 to be formed with an overall dimension in the y-direction larger than that permissible by the lithography equipment without generating defects. Further, the spaced mask portion 2018 is spaced from the spaced mask portion 2016 by a gap having a width 2034. Like the opening 2028, the width 2034 of the gap is approximately equal to or less than the width of two spacers deposited on opposing sidewalls of the spaced mask portions. As such, when spacers are formed on the protect mask 2014, the gap between the spaced mask portions 2014 and 2018 will be filled. The gap between the spaced mask portions 2016 and 2018 may be referred to as a merge region.

Figure 20:
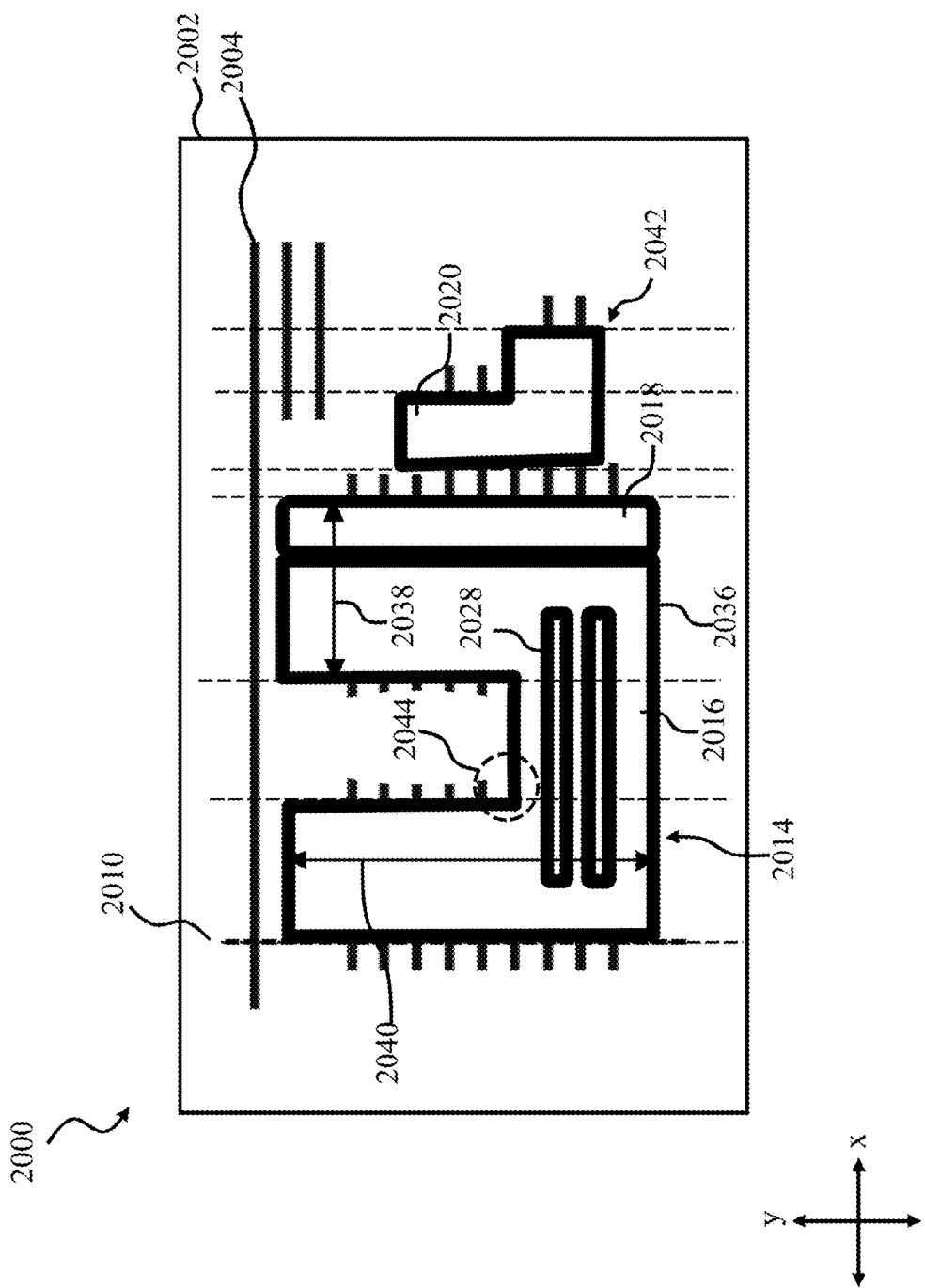

Referring now to FIG. 20, illustrated is a subsequent stage in the method for patterning the fin structures 2004 on the integrated circuit device 2000. Specifically, spacers 2036 have been deposited onto the sidewalls of the protect mask 2014. The spacers 2036 include a patterning or masking material that has an etch rate lower than the etch rate of the photoresist material forming the protect mask 2014 and etch rate of the material forming the fin structures 2004. In other words, the spacer material has etch selectivity to the photoresist and fin material. In some embodiments, the spacers 2036 are formed of silicon nitride (SiN), silicon oxide (SiO), a metal oxide, or another oxide formed using a low thermal process. The spacers 2036 are formed by various deposition processes, lithography processes, etching processes, or combinations thereof, such as the processes described herein. As shown in FIG. 20, the spacers 2036 are formed around the entirety of the each of the spaced mask portions 2016, 2018, and 2020 of the protect mask 2014.

Notably, because the gap between the spaced mask portions 2016 and 2018 is approximately equal to or less than the width of two spacers, the spacer material deposited on the sidewall of the spaced mask portion 2016 has merged with the spacer material deposited on the sidewall of the spaced mask portion 2018, such that the fin structures 2004 within the gap are entirely covered with spacer material. In effect, the spaced mask portions 2016 and 2018 are merged into a continuous mask portion. Similarly, the spacers deposited on the sidewalls of the opening 2028 in the spaced mask portion 2016 have merged, such that the fin structures 2004 exposed by the opening are entirely covered with spacer material.

The continuous mask portion formed from the merging of spaced mask portions 2016 includes a dimension 2038 in the x-direction that is greater than the critical dimension limits of the lithography equipment utilized to form the desired non-rectangular pattern. Additionally, because the opening 2028 in spaced mask portion 2016 has been filled with merged spacer material, the spaced mask portion 2016 now includes a dimension 2040 in the y-direction that is greater than the critical dimension limits of the lithography equipment.

The protect mask 2014 together with the spacers 2036 have an outer boundary that corresponds to the outer boundary defining the non-rectangular pattern to be formed in the fin structures 2004. That is, the protect mask 2014 and spacers 2036 together cover the portion of the fin structures 2004 that will form the non-rectangular pattern. For example, the spacer along the left edge of the protect mask 2014 is aligned along the broken line 2010 that represents an outer edge of the desired non-rectangular pattern. All portions of the fin structure 2004 to the left of the spacer 2036 along the broken line 2010 will be removed in a subsequent etching step. In that regard, all cuts made to the fin structure in the x-direction are dictated by the positioning of the spacers 2036.

Figure 21:
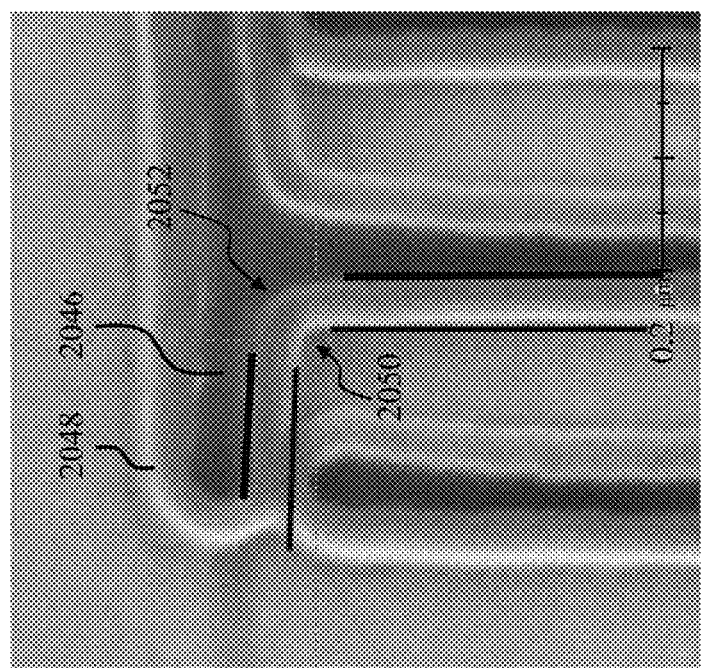
FIG. 21 illustrates an example of an interior right-angle corner of a photoresist-based protect mask having a spacer deposited thereon.

Additionally, the use of the spacers 2036 to define the outer boundaries of the non-rectangular pattern reduces the amount of corner rounding during the subsequent etching process. Specifically, the physical characteristics of the spacer material allow the right-angle corners of the spacers 2036 to be closer to a ninety degree angle than the right-angle corners of the photoresist material forming the protect mask 2014. Exterior right-angle corners, such as corner 2042, as well as interior right-angle corners, such as corner 2044, of the spacers 2036 are closer to ninety degrees than the exterior and interior right-angle corners of the protect mask 2014 alone. In some embodiments, the interior angle 2044 may be in the range from 85 degrees to 95 degrees. The fidelity and sharpness of the interior corners formed by the spacer material is substantially greater than the fidelity and sharpness of interior corners formed only by the photoresist material of the mask portions. FIG. 21 shows an example of an interior right-angle corner of a photoresist-based protect mask having a spacer deposited thereon (similar to the corner 2044 in FIG. 20). In FIG. 21, a photoresist material 2046 has a spacer material 2048 deposited on its sidewall. As shown, an interior corner 2050 formed by the spacer material 2048 is substantially closer to a ninety degree angle than an interior corner 2052 formed by the photoresist material 2054. Additionally, FIG. 21 illustrates that the fidelity and sharpness of the interior corner 2050 formed by the spacer material 2048 is substantially greater than the fidelity and sharpness of the interior corner 2052 formed by the photoresist material 2054.

Figure 22:
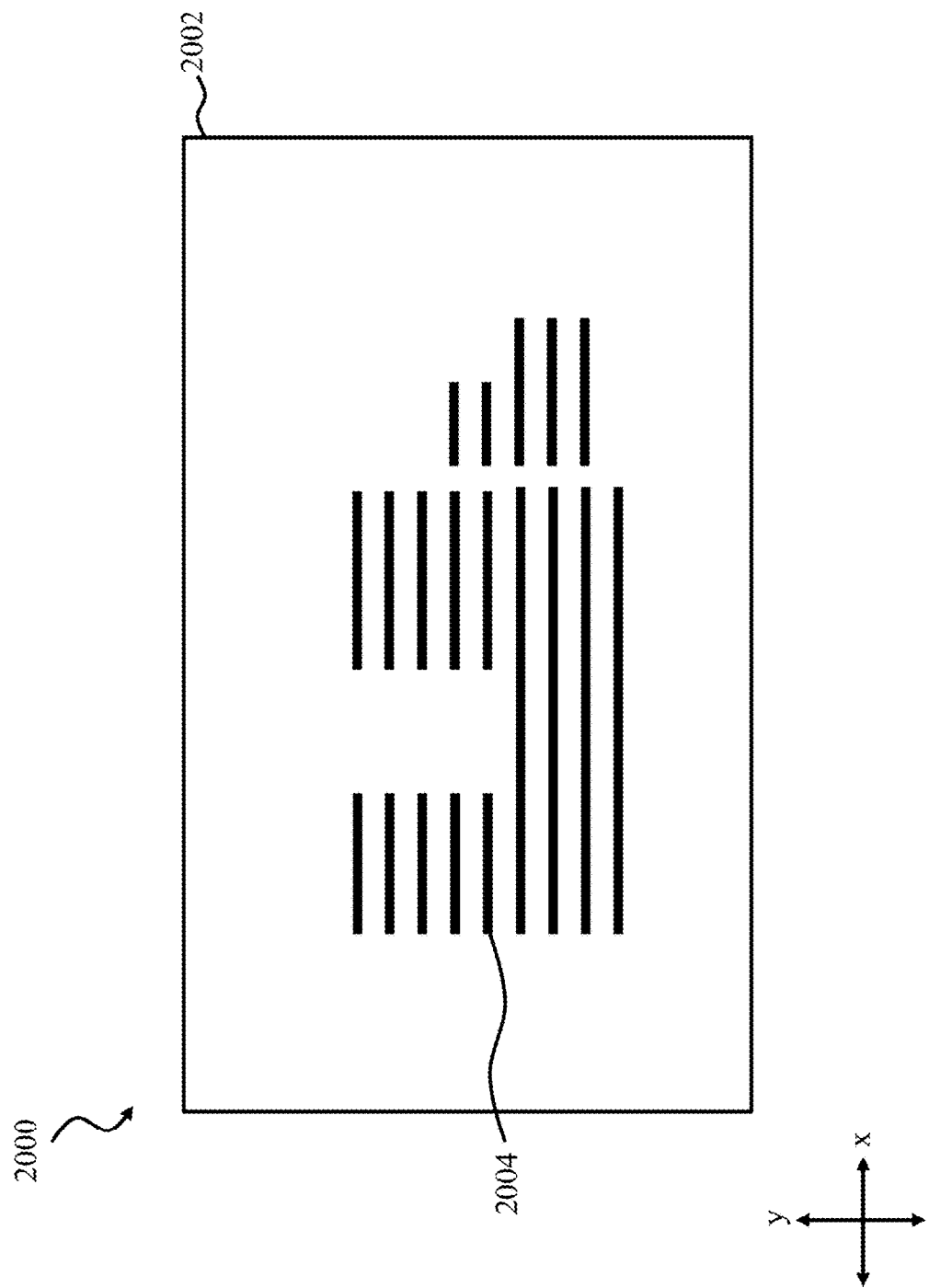

Referring now to FIG. 22, illustrated is a subsequent stage in the method for patterning the fin structures 2004 on the integrated circuit device 2000. Specifically, as shown in FIG. 22, the portions of the fin structures 2004 not protected by the protect mask 2014 and spacers 2036 have been removed, for example, by an etching process performed between FIGS. 20 and 22. The remaining portions of the fin structures 2004 form the desired non-rectangular pattern. Because the spacer material forming the spacers 2036 has a lower etch rate than the photoresist material of the protect mask 2014, the portions of the fin structures 2004 forming the edges of the non-rectangular pattern are better protected during the etching process, thereby (i) reducing corner rounding and inaccurate fin length, and (ii) increasing fidelity and sharpness of interior corners. As an aspect of this, each end of every fin in the non-rectangular pattern is defined by spacer material rather than photoresist material, proving for accurate fin cutting during the etching process.

The patterned fin structures may be subject to any number of subsequent processing steps so as to form a plurality of FinFET devices using the fins.

Figure 23:
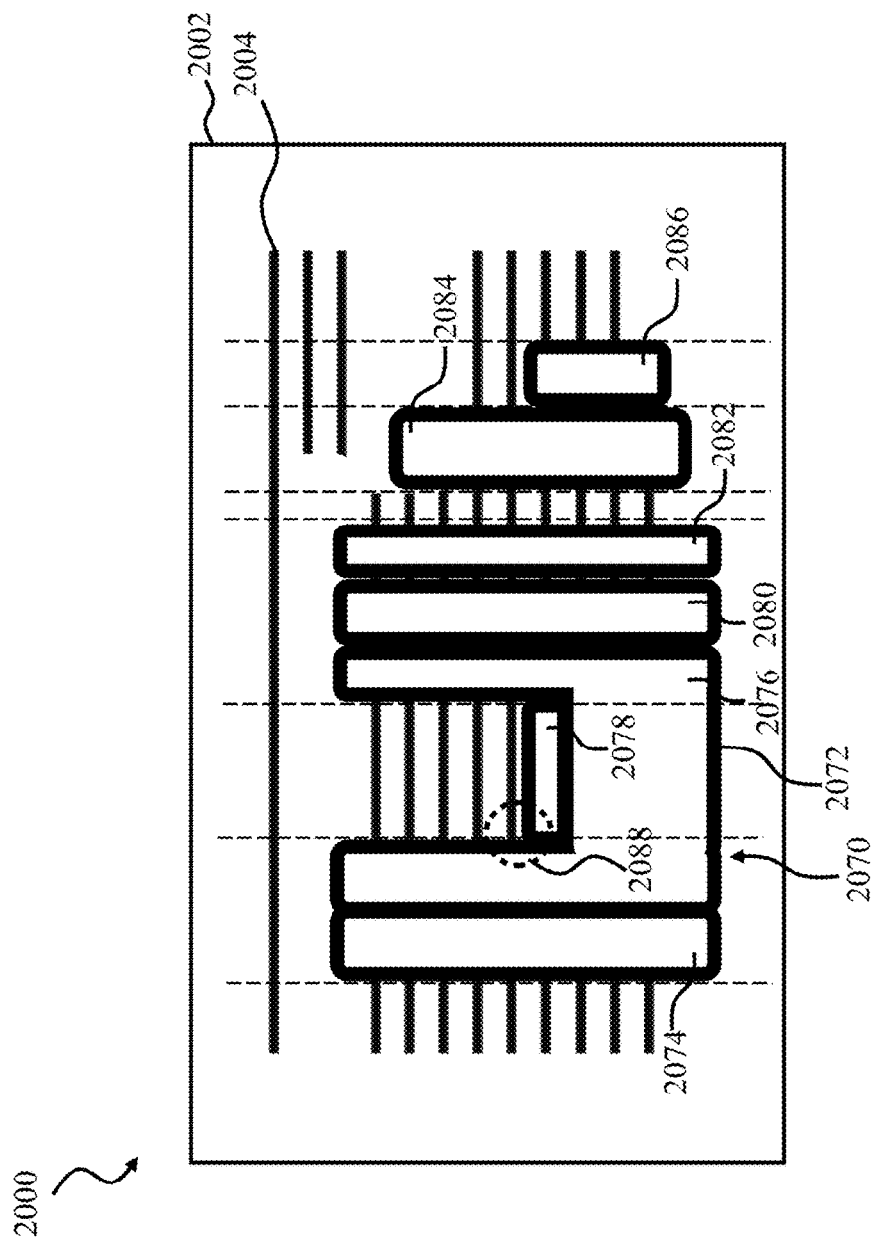
FIG. 23 is a top view of an alternate version of the protect mask shown in FIG. 20 according to another embodiment of the present disclosure

Referring now to FIG. 23, illustrated is a top view of an alternate version of the protect mask 2014 shown in FIG. 20 according to another embodiment of the present disclosure. Specifically, FIG. 23 illustrates a protect mask 2070 formed of photoresist material upon which spacers 2072 have been deposited. The spacers 2072 are similar to the spacers 2036 in FIG. 20. The protect mask 2070 includes spaced mask portions 2074, 2076, 2078, 2080, 2082, 2084, and 2086. The width between spaced mask portions 2074, 2076, 2078, 2080, 2082 is approximately equal to or less than the width of two spacers deposited on opposing sidewalls of the respective spaced mask portion, and thus the deposition of the spacers 2072 has merged the spaced mask portions into a single continuous mask portion. The merged mask portion includes an interior right-angle corner 2088 that is formed by the close proximity of the spaced mask portion 2076 and 2078. Specifically, the spacer material deposited on the sidewall of the spaced mask portion 2076 extending in the y-direction has merged with the spacer material deposited on the sidewall of the spaced mask portion 2078 extending in the x-direction. The merged spacer material forms the interior corner 2088 angle that has substantially increased fidelity and sharpness as compared to an interior corner formed by the photoresist material of the mask portions. In some embodiments, the interior angle 2088 may be approximately ninety degrees or, in other embodiments, the interior angle may be in the range from 85 degrees to 95 degrees. Similarly, the spaced mask portions 2084 and 2086 have been merged by the spacers 2072 into a second continuous mask portion with an interior corner angle having increased fidelity and sharpness and an angle that is approximately ninety degrees.

Figure 24:
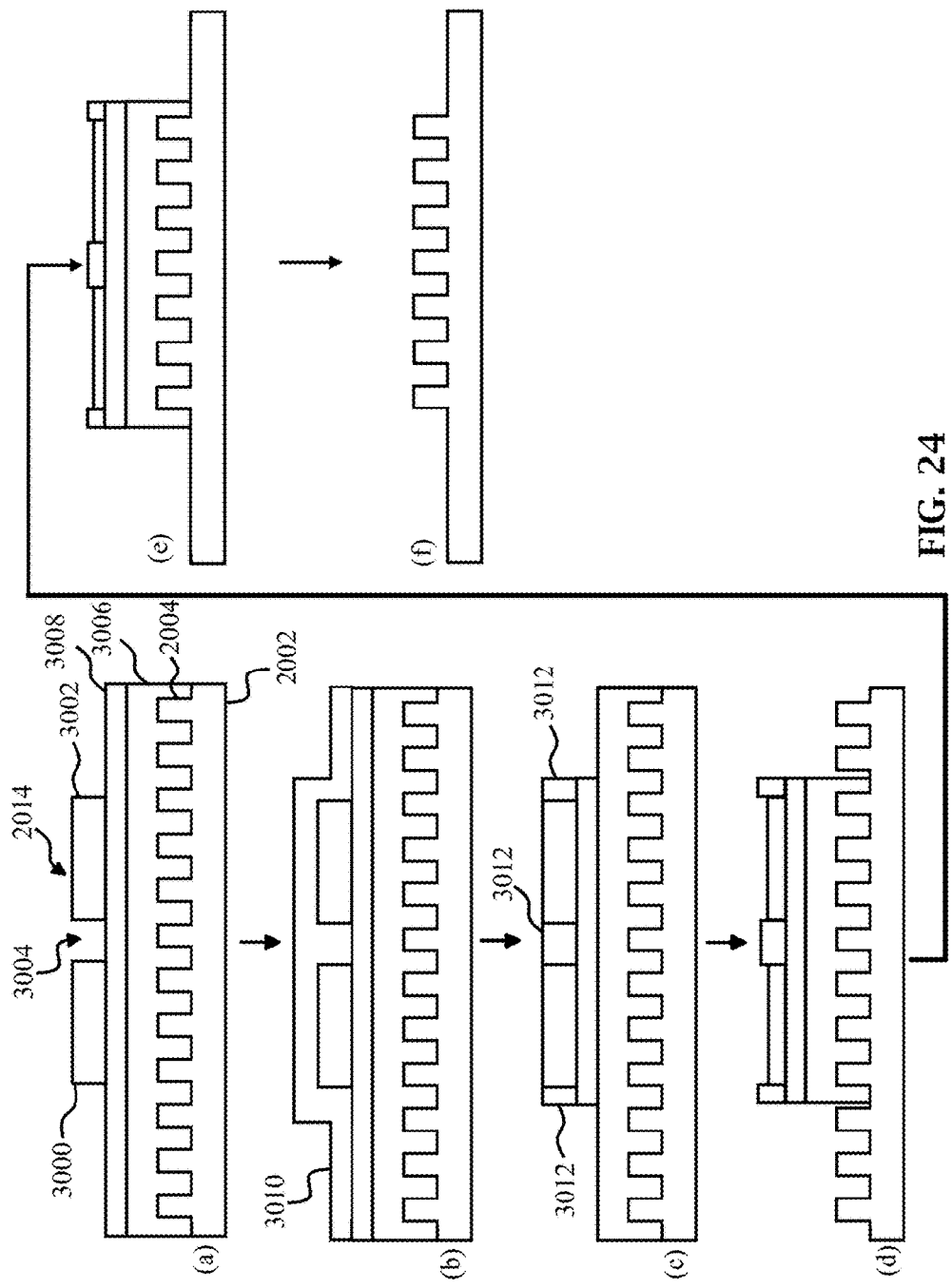
FIG. 24 illustrates side views of an integrated circuit device during various stages of fabrication according to various aspects of the present disclosure.

Referring now to FIG. 24, illustrated are side views of the integrated circuit device 2000 during various stages of fabrication according to various aspects of the present disclosure. Specifically, the fabrication method illustrated in FIG. 24 is a simplified version of the fin patterning method described in association with FIGS. 16-22. For the sake of clarity, similar elements will be given the same reference numerals. Also, for the sake of clarity, elements unchanged from one stage to another will not be re-labeled with a reference numeral.

At stage (a) in FIG. 24, the array of fin structures 2004 are disposed over the substrate 2002, where adjacent fin structures 2004 are spaced from one another. The protect mask 2014 is disposed over the fin structures 2004. In the illustrated embodiment, the protect mask 2014 includes two spaced mask portions 3000 and 3002, with a gap 3004 therebetween. The gap 3004 is approximately equal to or less than the width of two spacers to be deposited on opposing sidewalls of the spaced mask portions 3000 and 3002. Further, in the embodiment of FIG. 24, the protect mask 2014 includes three layers: a bottom layer 3006, a middle layer 3008, and a photoresist layer which forms the spaced mask portions 3000 and 3002, with only the photoresist layer being photosensitive. The three layer protect mask 2014 allows for better depth of focus control while offering better protection of the fin structures during etching processes. In other embodiments, the protect mask 2014 may have fewer number of layers, or may be a single layer of photoresist.

Proceeding to stage (b), spacer material 3010 has been deposited over the protect mask 2014. The spacer material 3010 has etch selectivity to the photoresist and fin material. In some embodiments, the spacer material 3010 is silicon nitride (SiN), silicon oxide (SiO), a metal oxide, or another oxide formed using a low thermal process. Next, at stage (c), the spacer material 3010 is patterned into spacers 3012. The spacers surround the spaced mask portions 3000 and 3002. And, because the gap 3004 is approximately less than the width of two spacers, the spacers 3012 have filled in the gap and merged the spaced mask portions 3000 and 3002. Also, the portions of the middle layer 3008 not protected by the photoresist and spacers 3012 have been etched away. At stage (d), another etch has been performed and the portions of the bottom layer 3006 not protected by the photoresist and spacers 3012 have been removed.

Then, at stage (e), the fin structures 2004 not protected by the combination of the protect mask 2014 and spacers 3012 are removed, for example, by an etching process. Finally, at stage (f), the protect mask 2014 and spacers 3012 are removed and only the portions of the fin structures forming the desired non-rectangular pattern remain.

One of ordinary skill in the art would recognize that the fabrication method illustrated in FIG. 24 is simply an example and may include additional or non-illustrated stages.

Figure 25:
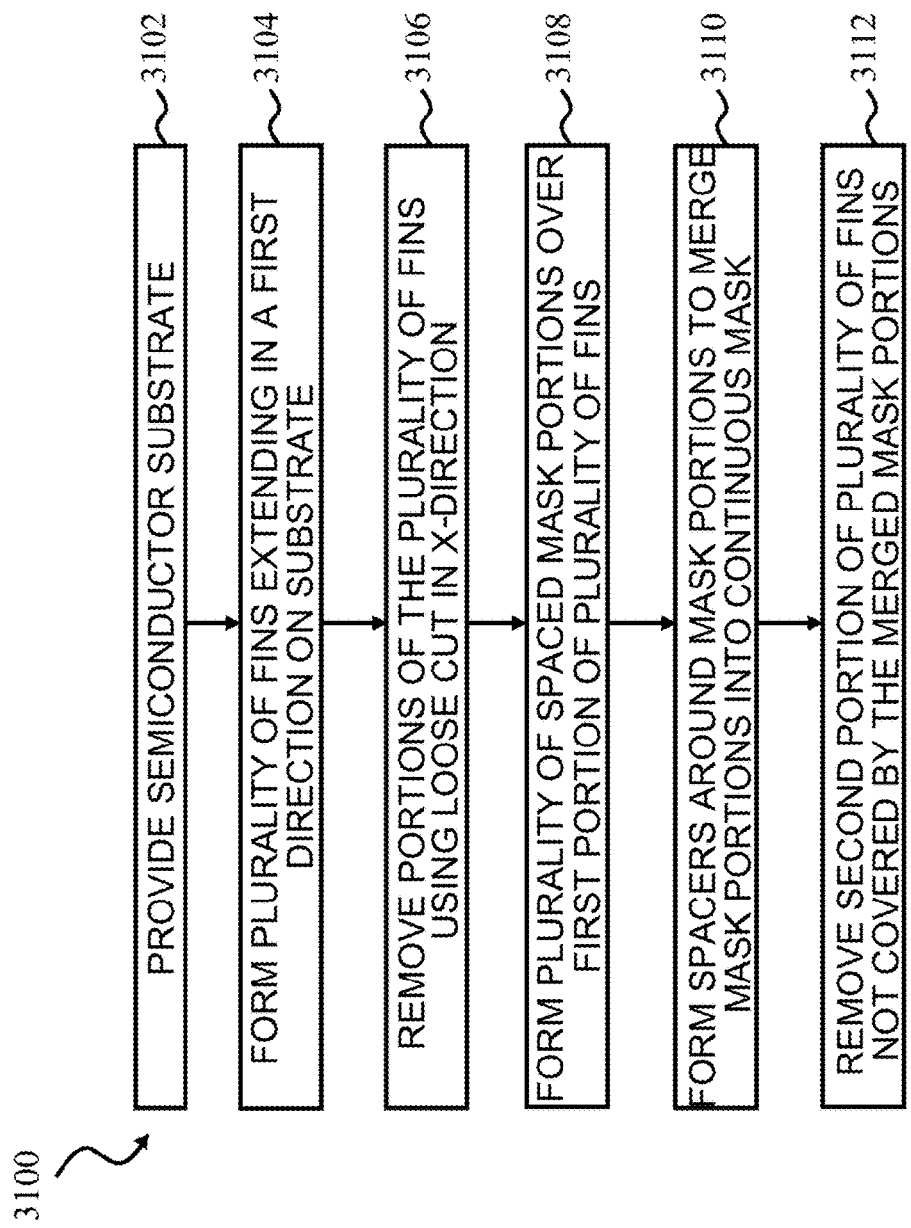
FIG. 25 is a high-level flowchart of a method for forming a non-rectangular pattern defined by an outer boundary according to various aspects of the present disclosure.

Referring now to FIG. 25, illustrated is a high-level flowchart of a method 3100 for forming a non-rectangular pattern defined by an outer boundary according to various aspects of the present disclosure. The method 3100 begins at block 3102 where a semiconductor substrate is provided. Next, at block 3104, a plurality of spaced fins extending in first direction are formed on the substrate. The method 3100 then optionally proceeds to block 3106 where portions of the plurality of fins are removed using "loose" cuts in the x-direction. That is, the ends of the fins are cut but not all the way to the desired edge of the non-rectangular pattern. The remaining portions of fin structures may extend past the desired edge and are removed in a subsequent step of the patterning process. During the optional block 3106, redundant fins in the y-direction may also be removed.

Next, in block 3108, a plurality of spaced mask portions are formed over a first portion of the plurality of fins. The width of the gap between the mask portions (i.e., the merge region) is approximately equal to or less than the width of two spacers to be deposited on opposing sidewalls of the spaced mask portions. The outer boundary of the spaced mask portions is within the outer boundary of the desired non-rectangular pattern. The method 3100 then proceeds to block 3110 where spacer material is deposited over the plurality of spaced mask portions and patterned to form spacers surrounding the mask portions. The spacers formed on the mask portions within the gap merge and cover the fin structures previously exposed by the gap. The plurality of mask portions together with the merged spacers form a continuous mask having an outer boundary that corresponds to the outer boundary of the desired non-rectangular pattern.

Finally, the method 3100 ends at block 3112 where the plurality of fins not covered by the merged mask portions are removed, for example, by an etching process. The remaining fins form the desired non-rectangular pattern. Additional steps may be performed to form FinFET devices on the remaining fins.

It is understood that the method 3100 for forming a non-rectangular pattern in a plurality of fins is simply an example embodiment, and in alternative embodiments, additional and/or different steps may be included in the method. For example, first fin removal performed at block 3106 may not be performed and the only the fin removal process at block 3112 using a combination of photoresist material and spacer material may be performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a method of forming a non-rectangular pattern defined by an outer boundary. The method includes providing a semiconductor substrate, forming a plurality of elongated protrusions on the semiconductor substrate, the elongated protrusions extending in a first direction, and forming a mask covering a first portion of the elongated protrusions, the mask being formed of a first material having a first etch rate. The method also includes forming a spacer surrounding the mask, the spacer being formed of a second material with an etch rate lower than the etch rate of the first material, the mask and the spacer together covering a second portion of the elongated protrusions larger than the first portion of the elongated protrusions, and wherein an outer boundary of the spacer corresponds to the outer boundary of the non-rectangular pattern. Further, the method includes removing a remaining portion of the plurality of elongated protrusions not covered by the mask and spacer.

In another exemplary aspect, the present disclosure is directed to a method for patterning a plurality of features for fin-like field-effect transistor (FinFET) devices. The method includes providing a semiconductor substrate and forming a plurality of spaced elongated protrusions on the semiconductor substrate, the elongated protrusions extending in a first direction. The method also includes forming first and second spaced mask portions over the plurality of elongated protrusions, the first and second spaced mask portions being formed of a first material with a first etch rate and being separated by a merge region and depositing a spacer material over the first and second spaced mask portions and within the merge region, the spacer material having an etch rate lower than the etch rate of the first material. Further, the method includes removing a portion of the spacer material to form a first spacer surrounding the first spaced mask portion and a second spacer surrounding the spaced second mask portion, the first and second spacers merging in the merge region such that the first and second spaced mask portions and first and second spacers form a continuous protect mask covering a continuous portion of the plurality of elongated protrusions. The method also includes removing a remaining portion of the plurality of elongated protrusions not covered by the continuous protect mask to form a non-rectangular pattern in the plurality of elongated protrusions.

What is claimed is:

1. A method, comprising:
   forming elongated protrusions on a semiconductor substrate;
   forming a mask covering a first portion of the elongated protrusions;
   forming a spacer surrounding the entire perimeter of a patterned resist layer of the mask, the mask and the spacer together covering a second portion of the elongated protrusions; and
   removing a portion of the elongated protrusions not covered by either the mask or the spacer.

2. The method of claim 1, wherein an etch rate of the spacer is lower than an etch rate of the mask.

3. The method of claim 2, wherein the mask comprises a photoresist and the spacer comprises one of: a silicon nitride, a silicon oxide, and a metal oxide.

4. The method of claim 2, wherein the etch rate of the spacer is lower than an etch rate of the elongated protrusions.

5. The method of claim 1, wherein the forming of the mask includes forming first and second mask portions that are spaced by a gap.

6. The method of claim 5, wherein the forming of the spacer includes forming first and second spacer portions around the first and second mask portions respectively such that the first and second spacer portions merge within the gap.

7. The method of claim 5, wherein a width of the gap is approximately less than twice a width of the spacer.

8. The method of claim 1, wherein the mask includes an opening having a width approximately less than twice a width of the spacer; and wherein the forming of the spacer includes depositing a spacer material to fill the opening.

9. The method of claim 1, wherein the forming of the mask includes:
forming a bottom layer over the elongated protrusions;
forming a middle layer over the bottom layer; and
forming the patterned resist layer over the middle layer,
wherein the forming of the spacer includes depositing a spacer material over the middle layer and covering the patterned resist layer.

10. The method of claim 1, wherein an outer boundary of the spacer and the mask corresponds to an outer boundary of a non-rectangular pattern.

11. The method of claim 10, wherein:
the non-rectangular pattern includes a right-angle corner;
the mask includes a first corner corresponding to the right-angle corner; and
the spacer includes a second corner corresponding to the right-angle corner, wherein the second corner is closer to ninety degrees than the first corner.

12. The method of claim 11, wherein the right-angle corner is an interior corner.

13. The method of claim 10, further comprising:
before the forming of the mask, performing a cut process to remove an end portion of at least one of the elongated protrusions, wherein, subsequent to the performing of the cut process, the at least one of the elongated protrusions extends outside of the outer boundary of the non-rectangular pattern.

14. A method, comprising:
providing a semiconductor substrate;
forming elongated protrusions on the semiconductor substrate;
forming first and second mask portions over the elongated protrusions, the first and second mask portions being separated by a gap;
depositing a spacer material over the first and second mask portions and within the gap, an etch rate of the spacer material being lower than an etch rate of the first and second mask portions;
removing a portion of the spacer material to form a first spacer on sidewalls of the first mask portion and a second spacer on sidewalls of the second mask portion, the first and second spacers merging in the gap, the first and second mask portions and the first and second spacers collectively forming a protect mask being of a non-rectangular shape; and
removing a portion of the elongated protrusions not covered by the protect mask,
wherein the etch rate of the spacer material is lower than an etch rate of the elongated protrusions, and
wherein:
the first and second mask portions comprise a photoresist;
the spacer material is one of: a silicon nitride, a silicon oxide, and a metal oxide; and
the elongated protrusions comprises silicon.

15. The method of claim 14, wherein the first mask portion includes an opening, and wherein the depositing of the spacer material includes filling the opening with the spacer material.

16. A method, comprising:
forming elongated protrusions on a semiconductor substrate;
forming a mask over the elongated protrusions, the mask having a gap;
forming a spacer on sidewalls of the mask including filling the gap, an etch rate of the spacer being lower than an etch rate of the mask, the mask and the spacer collectively forming a protect mask, an outer boundary of the protect mask being non-rectangular; and
removing a portion of the elongated protrusions not covered by the protect mask,
wherein the forming of the mask includes:
forming a bottom layer over the elongated protrusions;
forming a middle layer over the bottom layer; and
forming a patterned resist layer over the middle layer, and
wherein the forming of the spacer includes depositing a spacer material over the middle layer and covering the patterned resist layer.

17. The method of claim 14, wherein the elongated protrusions extend lengthwise in a same direction.

18. The method of claim 14, wherein the elongated protrusions are fin structures for fin-like field effect transistor (FinFET) devices.

19. The method of claim 16, wherein the mask includes two or more mask portions and the gap is between two of the mask portions.

20. The method of claim 16, wherein the spacer includes one of: a silicon nitride, a silicon oxide, and a metal oxide.

* * * * *